United States Patent [19]
Turner et al.

[11] Patent Number: 5,931,000
[45] Date of Patent: Aug. 3, 1999

[54] COOLED ELECTRICAL SYSTEM FOR USE DOWNHOLE

[76] Inventors: William Evans Turner, 2081 Dennis La., Bethlehem, Pa. 18015; Ronald Seppa, 1958 Mattis Pl., Hellertown, Pa. 18055; William Edward Turner, 254 Townhouse, Hershey, Pa. 17033

[21] Appl. No.: 09/064,898

[22] Filed: Apr. 23, 1998

[51] Int. Cl.$^6$ .............. F23B 21/02; E21B 29/02
[52] U.S. Cl. .............. 62/3.2; 62/3.7; 62/259.2; 166/66
[58] Field of Search .............. 62/3.2, 259.2, 62/3.3, 3.7; 166/302, 66

[56] References Cited

U.S. PATENT DOCUMENTS

| | | | |
|---|---|---|---|
| 3,488,970 | 1/1970 | Hallenburg | 62/3.2 |
| 4,199,953 | 4/1980 | Richter, Jr. et al. | 62/3 |
| 4,375,157 | 3/1983 | Boesen | 62/260 |
| 4,407,136 | 10/1983 | De Kanter | 62/64 |
| 4,935,864 | 6/1990 | Schmidt et al. | 363/141 |
| 5,067,040 | 11/1991 | Fallik | 361/380 |
| 5,499,258 | 3/1996 | Kawano et al. | 372/34 |
| 5,515,683 | 5/1996 | Kessler | 62/3.7 |
| 5,547,028 | 8/1996 | Owens et al. | 166/302 |
| 5,569,950 | 10/1996 | Lewis et al. | 257/467 |
| 5,572,407 | 11/1996 | Sobhani | 361/719 |
| 5,602,860 | 2/1997 | Masonson | 372/34 |
| 5,603,220 | 2/1997 | Seaman | 62/3.7 |
| 5,618,459 | 4/1997 | Kamiya | 219/497 |
| 5,637,921 | 6/1997 | Burward-Hoy | 257/712 |
| 5,640,407 | 6/1997 | Freyman et al. | 372/36 |
| 5,655,375 | 8/1997 | Ju | 62/3.6 |

OTHER PUBLICATIONS

Furon, Thermal Management Solutions for Microprocessors (1996) New Haven CT.

*Primary Examiner*—William Doerrler
*Attorney, Agent, or Firm*—Woodcock Washburn Kurtz Mackiewicz & Norris LLP

[57] ABSTRACT

A system for cooling electronic components in the downhole assembly of a drill string through which a drilling fluid flows. The cooling system includes a thermoelectric cooler that conducts heat from the electronic component to a first heat transfer surface of a thermally conductive chassis. The heat received by the first heat transfer surface is transferred within the chassis to a second heat transfer surface that then transfers the heat to a housing. The housing transfers the heat to the drilling fluid flowing over the housing. To ensure good conductive heat transfer between the chassis and the housing, the chassis portions are urged outwardly toward the housing surface. A conformable thermal interface material preferably forms the chassis second heat transfer surface. The system may also includes a thermoelectric cooler mounted in a drill pipe portion of the downhole assembly that transfer heat from the an electronic component mounted in the drill pipe to the drill pipe, which then transfers the heat to the drilling fluid.

57 Claims, 14 Drawing Sheets

COOLED ELECTRICAL SYSTEM FOR USE DOWNHOLE

FIELD OF THE INVENTION

The current invention is directed to an apparatus for drilling or monitoring wells, such as gas, oil or geothermal wells. More specifically, the current invention is directed to a cooled electrical system used downhole.

BACKGROUND OF THE INVENTION

In underground drilling, such as gas, oil or geothermal drilling, a bore is drilled through a formation deep in the earth. Such bores are formed by connecting a drill bit to sections of long pipe, referred to as a "drill pipe," so as to form an assembly commonly referred to as a "drill string" that extends from the surface to the bottom of the bore. The drill string is rotated, thereby causing the drill bit to advance into the earth, forming the bore. In order to lubricate the drill bit and flush cuttings from its path, a high pressure fluid, referred to as "drilling mud," is directed through an internal passage in the drill string and out through the drill bit. The drilling mud then flows to the surface through the annular passage formed between the drill string and the surface of the bore.

The distal end of a drill string, which includes the drill bit, is referred to as the "downhole assembly." In addition to the drill bit, the downhole assembly often includes specialized modules within the drill string that make up the electrical system for the drill string. Such modules may include sensing modules, a control module and a pulser module.

In some applications, the sensing modules provide the drill operator with information concerning the formation being drilled through using techniques commonly referred to as "measurement while drilling" (MWD) or "logging while drilling" (LWD). For example, resistivity sensors may be used to transmit, and then receive, high frequency wavelength signals (e.g., electromagnetic waves) that travel through the formation surrounding the sensor. The construction of one such device is shown in U.S. application Ser. No. 08/751,271, entitled "Apparatus for Joining Sections of Pressurized Conduit," hereby incorporated by reference in its entirety. By comparing the transmitted and received signals, information can be determined concerning the nature of the formation through which the signal traveled, such as whether it contains water or hydrocarbons. One such method for sensing and evaluating the characteristics of the formation is disclosed in U.S. Pat. No. 5,144,245 (Wisler), hereby incorporated by reference in its entirety. Other sensors are used in conjunction with magnetic resonance imaging (MRI) such as that disclosed in U.S. Pat. No. 5,280,243 (Miller), hereby incorporated by reference in its entirety. Still other sensors include gamma scintillators, which are used to determine the natural radioactivity of the formation, and nuclear detectors, which are used to determine the porosity and density of the formation.

In other applications, sensing modules provide information concerning the direction of the drilling and can be used, for example, to control the direction in which the drill bit advances in a steerable drill string. Such sensors may include a magnetometer to sense azimuth and an accelerometer to sense inclination.

Signals from the sensor modules are typically received and processed in the control module, which may incorporate specialized electronic components to digitize and store the sensor data. In addition, the control module may also direct the pulser modules to generate pulses within the flow of drilling fluid that contain information derived from the sensor signals. These pressure pulses are transmitted to the surface, where they are detected and decoded, thereby providing information to the drill operator.

As can be readily appreciated, such an electrical system will include many sophisticated electronic components, such as the sensors themselves, which in some cases include or are mounted on printed circuit boards, and associated components for storing and processing data in the control module, which may also include printed circuit boards. Unfortunately, many of these electronic components generate heat. For example, the components of a typical MWD system (i.e., a magnetometer, accelerometer, solenoid driver, microprocessor, power supply and gamma scintillator) may generate over 20 watts of heat. Moreover, even if the electronic component itself does not generate heat, the temperature of the formation itself may exceed the maximum temperature capability of the components.

Over-heating can result in failure or reduced life expectancy from such electronic components. For example, photomultiplier tubes, which are used in gamma scintillators and nuclear detectors for converting light energy from a scintillating crystal into electrical current, cannot operate above 175° C. Consequently, cooling of the electronic components is important. Unfortunately, cooling is made difficult by the fact that the temperature of the formation surrounding deep wells, especially geothermal wells, is typically relatively high, and may exceed 200° C.

Cooling methods used in applications associated with the monitoring and logging of existing wells, as distinguished from the drilling of new wells, typically require isolating the electronic components from the formation by incorporating them within a vacuum insulated dewar flask. One such approach is shown in U.S. Pat. No. 4,375,157 (Boesen), and includes thermoelectric coolers that are powered from the surface and that transfer heat from within the dewar tube to the well fluid by means of a vapor phase heat transfer pipe. Such approaches are not suitable for use in drill strings since dewar flasks are not sufficiently robust to withstand the shock, vibration and high pressures to which the down hole assembly of a drill string is subjected. Moreover, the size of such configurations makes them difficult to package into a down hole assembly.

Consequently, it would be desirable to provide a rugged yet reliable system for effectively cooling the electronic components that is suitable for use in a well. It would also be desirable to provide a cooling system that was capable of being used in a downhole assembly of a drill string.

SUMMARY OF THE INVENTION

It is an object of the current invention to provide a rugged yet reliable system for effectively cooling the electronic components that is suitable for use in a well, and preferably, that is capable of being used in a downhole assembly of a drill string. This and other objects is accomplished in a cooled electrical system in which an electronic component is juxtaposed with one or more thermoelectric coolers that facilitate the transfer of heat from the component to the fluid in the well.

According to the current invention, the thermoelectric coolers are placed in heat flow communication with the housing enclosing the electronic component. According to some embodiments of the current invention, the thermoelectric cooler is in direct conductive heat flow communication with both the electronic component and the housing or drill pipe, so that the cooler transfers heat from the electronic component to the housing or drill pipe without intervening members. In other embodiments, heat flow is accomplished by mounting the electronic component and thermoelectric cooler in or on a chassis. In some embodiments, the electronic component transfers heat directly to the thermoelectric cooler and the chassis acts as a thermal conductor that transfers heat from the thermoelectric cooler to the housing indirectly. In still other embodiments, the chassis acts as a thermal conductor that transfers heat from the electronic component to the thermoelectric cooler indirectly, and the thermoelectric cooler then transfers heat directly to the housing. Insulators are preferably used to prevent the unwanted transfer of heat from the housing, drill pipe, or chassis into the electronic component. Preferably, either a thermal insulator or a thermoelectric cooler is disposed adjacent each surface of the electronic component.

In a preferred embodiment, the invention comprises a cooled electronic system for use in a well containing a fluid that includes (i) a housing adapted to be disposed within the well, whereby the housing is exposed to the fluid and is in convective heat transfer therewith, (ii) a thermoelectric cooler, the thermoelectric cooler comprising a hot plate on one side thereof, a cold plate on another side thereof, and means for transferring heat from the cold plate to the hot plate, (iii) an electronic component, the electronic component forming a first surface thereof, the first surface of the electronic component being in heat flow communication with the cold plate of the thermoelectric cooler, whereby the cold plate receives heat from the electronic component and transfers the received heat to the hot plate, and (iv) means for placing the hot plate of the thermoelectric cooler in conductive heat transfer communication with the housing, whereby heat from the hot plate is conducted to the housing and then transferred to the fluid by convection.

In one specific embodiment, the cooled electronic system comprises (i) a housing adapted to be disposed within the well, whereby the fluid flows over the housing, (ii) at least a first thermoelectric cooler, the first thermoelectric cooler comprises a hot plate on one side thereof, a cold plate on another side thereof, and means for transferring heat from the cold plate to the hot plate, (iii) an electronic component, the electronic component having at least a first surface, the first surface of the electronic component being in heat flow communication with the cold plate of the first thermoelectric cooler, whereby the cold plate receives heat from first electronic component and transfers the received heat to the hot plate, and (iv) a thermal conductor having first and second surfaces, the first surface of the thermal conductor being in heat flow communication with the hot plate, the second surface of the thermal conductor being in heat flow communication with the housing, whereby the thermal conductor conducts heat from the hot plate to the housing, and whereby the housing transfers the heat to the fluid in the well.

This embodiment may also include means for effecting thermal conductive heat transfer between the thermal conductor, which is preferably a chassis in which the electronic component and thermoelectric cooler are mounted, and the housing by urging the chassis into contact with the housing.

In another specific embodiment, the cooled electronic system comprises (i) a housing adapted to be disposed within the well and that is exposed to fluid in the well, (ii) at least first and second thermoelectric coolers, each of the first and second thermoelectric coolers comprising a hot plate on one side thereof, a cold plate on another side thereof, and means for transferring heat from the cold plate to the hot plate, (iii) an electronic component sandwiched between the first and second thermoelectric coolers, each of the first and second thermoelectric coolers oriented so that its respective cold plate is in heat flow communication with the electronic component, whereby each of the cold plates receives heat from the electronic component and transfers the received heat to its respective hot plate, and (iv) a thermally conductive chassis in which the electronic component and thermoelectric cooler sandwich is mounted, the chassis having first, second and third surfaces, the chassis first surface in heat flow communication with the hot plate of the first thermoelectric cooler, the chassis second surface in heat flow communication with the hot plate of the second thermoelectric cooler, the chassis third surface in heat flow communication with the housing, whereby the chassis conducts heat from the hot plates of the first and second thermoelectric coolers to the housing, and whereby the housing transfers the heat to the fluid flowing in the well.

DESCRIPTION OF THE PREFERRED EMBODIMENTS

Figure 1:
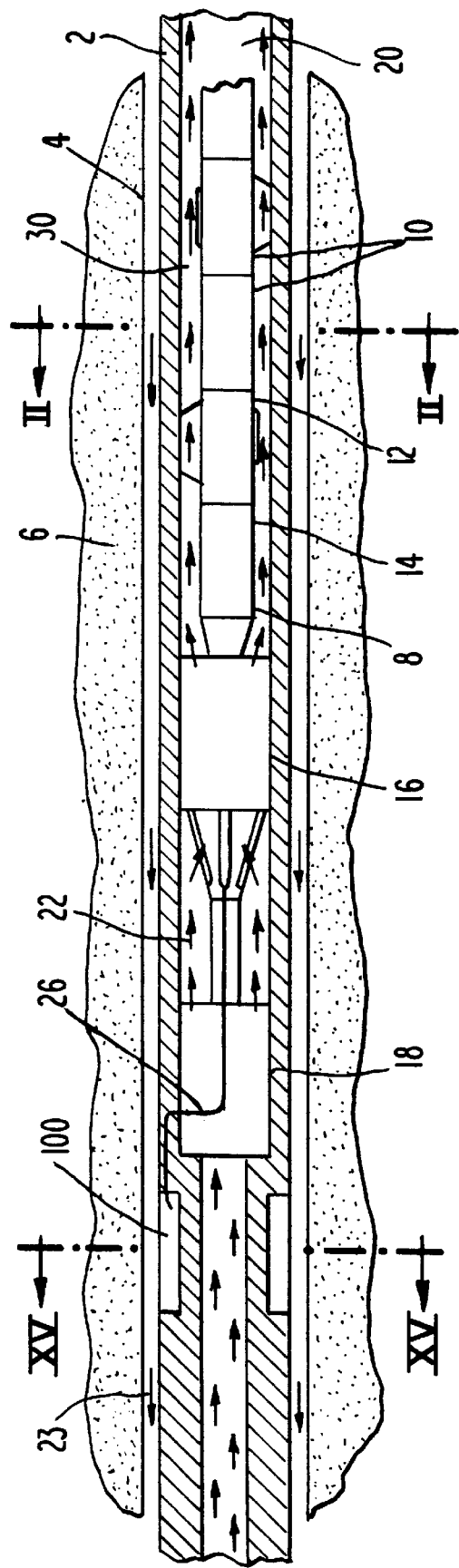
FIG. 1 is a longitudinal cross-section through a portion of a downhole assembly in drill string incorporating an electrical system cooled according to the current invention.

A portion of the downhole assembly of a drill string incorporating an electronic system according to the current invention is shown in FIG. 1. The drill string includes a drill pipe, or collar, 2 that extends through a bore 4 in an earthen formation 6. The bore 4 is created by a drill bit (not shown) that is coupled to the distal end of the downhole assembly. As is conventional, a centrally disposed passage 20 is formed within the drill pipe 2 and allows drilling mud 22 to be pumped from the surface down to the drill bit. After exiting the drill bit, the drilling mud 23 flows up through the annular passage formed between the outer surface of the drill pipe 2 and the internal diameter of the bore 4 for return to the surface. Depending on the drilling operation, the pressure of the drilling mud 22 flowing through the drill pipe internal passage 20 will typically be between 1,000 and 20,000 psi, and its flow rate and velocity will typically be in the 100 to 1500 GPM range and 5 to 150 fps range, respectively.

As also shown in FIG. 1, the downhole assembly also includes an electrical system 8 disposed within the central passage 20. The electrical system 8 includes a number of sensor modules 10, a control module 12, a power regulator module 14, a pulser module 18, and a turbine alternator 16 that are supported within the passage 20, for example, by struts extending between the modules and the drill pipe 2.

According to the current invention, power for the electrical system 8, including the electronic components and the thermoelectric coolers, discussed below, is supplied by the turbine alternator 16, which is driven by the drilling mud 22. The turbine alternator 16 may be of the axial, radial or mixed flow type. Alternatively, the alternator 16 could be driven by a positive displacement motor driven by the drilling mud 22, such as a Moineau-type motor.

Figure 2:
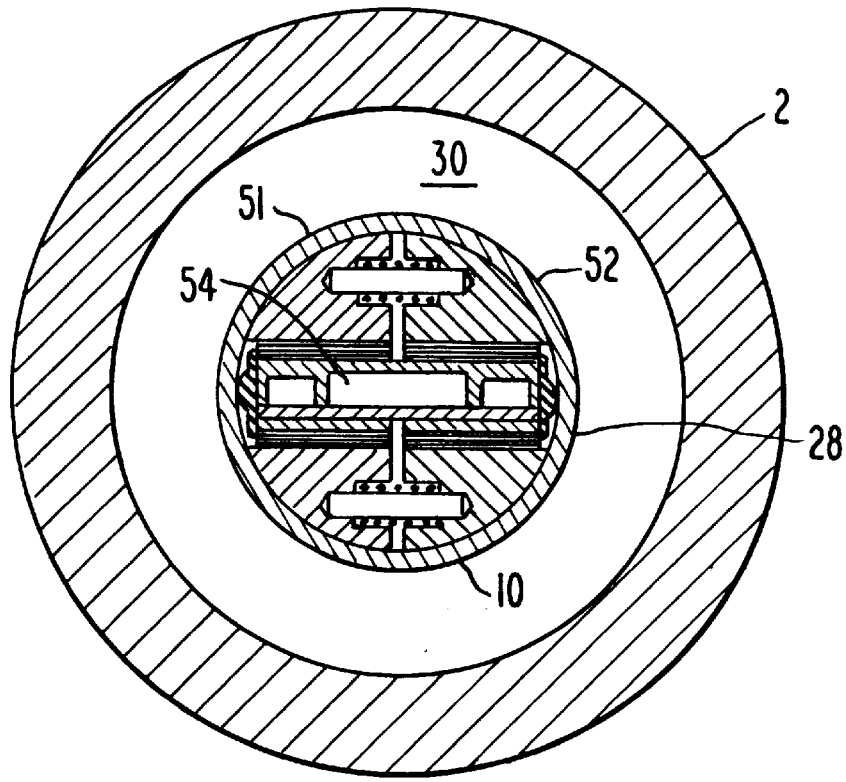
FIG. 2 is a transverse cross-section taken along line II—II shown in FIG. 1 showing the portion of the downhole assembly containing one of the sensor modules.

As shown in FIG. 2, each sensor module 10 is comprised of a cylindrical housing 52, which is preferably formed from stainless steel or a beryllium copper alloy. An annular passage 30 is formed between the outer surface 51 of the housing 52 and the inner surface of the drill pipe 2. The drilling mud 22 flows through the annular passage 30 on its way to the drill bit, as previously discussed. The housing 52 contains an electronic component 54 for the sensing device. The electronic component 54 may, but according to the invention does not necessarily, include one or more printed circuit boards associated with the sensing device, as previously discussed. Alternatively, the assembly shown in FIG. 2 could comprise the control module 12, power regulator module 14, or pulser module 18, in which case the electronic component 54 may be different than those used in the sensor modules 10, although it may, but again does not necessarily, include one or more printed circuit boards.

Figure 3:
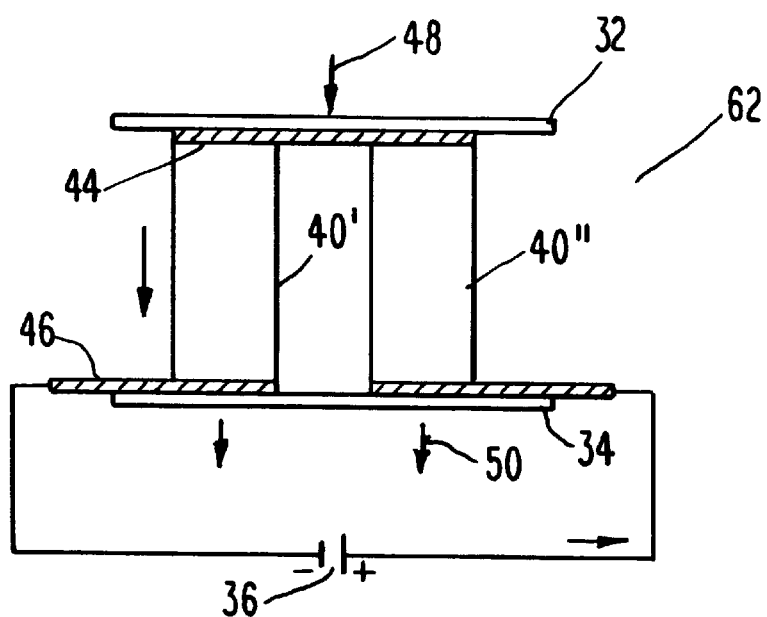
FIG. 3 is a schematic diagram of a thermoelectric cooler.

According to the current invention, one or more of the electronic components in the electrical system 8 are cooled by thermoelectric coolers. A thermoelectric cooler is a small, solid state heat pump that, conventionally, is semiconductor based. A typical thermoelectric cooler 62 suitable for use in the current invention is shown schematically in FIG. 3. In its simplest form, the device consists of two different types of semiconductors 40' and 40", such as a p-type and an n-type, respectively, sandwiched between plates 44 and 46, which are typically made from a ceramic material. The semiconductors 40' and 40" are connected electrically in series and thermally in parallel. A DC power source 36 provides energy to move electrons through the system. When a positive DC voltage from the power source 36 is applied to the n-type semiconductor 40", electrons pass from the low energy p-type semiconductor 40' to the high energy n-type semiconductor 40". In so doing, the electrons absorb energy (i.e., heat). As the electrons pass from the high energy n-type semiconductor 40" to the low energy p-type semiconductor 40', heat is expelled. Thus, heat energy 48 is initially transferred from a heat source 32 to a cold junction, or cold plate, 44. This heat is then transferred by the semiconductors to a hot junction, or hot plate, 46. The heat transferred is proportional to the current and the number of thermoelectric couples. From the hot plate 46, the heat 50 is transferred to a heat sink 34. Thus, thermoelectric coolers essentially cause heat to flow from a lower temperature to a higher temperature, analogous to pumping a fluid from a lower elevation to a higher elevation.

The heat pumping ability of thermoelectric coolers typically ranges from a few milliwatts to hundreds of watts. A single stage thermoelectric cooler, such as that shown schematically in FIG. 3, can achieve temperature differences between the hot and cold plates of 70° F. more, or can transfer heat at a rate of about 25 watts or more. Greater temperature differences, for example 130° F., and greater heat transfer rates are possible with a thermoelectric cooler employing a multistage or cascade arrangement in which the hot plate of one stage of thermoelectric cooler transfers heat to the cold plate of another stage of thermoelectric cooler. As used herein, the term "thermoelectric cooler" includes both a single stage thermoelectric cooler, as well as multistage and cascade arrangements of multiple thermoelectric cooler stages.

Semiconductors 40' and 40" for thermoelectric coolers 62 suitable for use in the current invention may be fabricated from an alloy of bismuth, telluride, selenium, and antimony. Preferably, they are doped and processed to yield oriented polycrystalline semiconductors with anisotropic thermoelectric properties. The plates 44 and 46 are preferably made from metallized beryllium oxide and/or aluminum oxide ceramics. Thermoelectric coolers are typically available in sizes ranging from $\frac{1}{8}$ inch square and $\frac{1}{100}$ inch thick to 2 inches square and $\frac{2}{10}$ inch thick. Temperature can be controlled to within 0.5° F.

The thermoelectric coolers are preferably supplied with DC power in the form of high quality current that is smooth and constant with very low ripple or noise. Preferably, pulse width modulation is used to convert the AC line voltage generated by the turbine alternator 16 to a lower DC signal, which is filtered, through control of the duty cycle and the power frequency applied to the thermoelectric coolers. Preferably, the frequency of the pulse width modulation is kept as low as possible to maintain a continuous output voltage.

Thermoelectric coolers have many advantages that make them suitable for use in a downhole assembly—they have solid state reliability, use no gas or refrigerants, are small and light weight, operate in any orientation, are resistant to shock and vibration, have no moving parts, generate no electrical noise, require no maintenance, are capable of precise temperature control, and have a long life. The current invention is directed to a configuration for a cooled electronic system in a downhole assembly that effectively utilizes thermoelectric coolers and that avoids the problems that previously rendered them unsuitable for use in a downhole environment.

According to the current invention, the electronic component is cooled by placing it in heat transfer communication with the drilling mud. As used herein, the term "heat flow communication" refers to the transfer of heat, for example, by conduction or convection, between two members, either directly, for example by surface contact, or indirectly through an intermediate member. As used herein, the term "direct conductive heat flow communication" refers to the transfer of heat by conduction between two members in contact with each other, without the aid of an intermediate member.

According to the current invention heat transfer from the electronic component to the drilling mud is accomplished by juxtaposing one or more thermoelectric coolers with the electronic component so that, ultimately, the thermoelectric cooler causes heat to flow from the electronic component to the drilling mud even though the drilling mud may be at a higher temperature than the electronic component. The thermoelectric cooler is placed in conductive heat flow communication with the housing, or in some embodiments, with the drill pipe, so that, preferably, substantially all of the heat transferred by the thermoelectric cooler is transferred to the housing or the drill pipe. From the housing or drill pipe, the heat is rejected to the drilling mud by convection.

In some embodiments, the transfer of heat is facilitated by mounting the electronic component and thermoelectric cooler in or on a chassis, which is preferably a separate component but could also be integrally formed with the module housing. In some embodiments, the thermoelectric cooler is positioned so that it is in direct conductive heat flow communication with the electronic component and the housing, in which case the chassis may be a thermal insulator. In other embodiments, the chassis acts as a thermal conductor that transfers heat from the thermoelectric cooler to the housing 52 indirectly. In still other embodiments, the chassis acts as a thermal conductor that transfers heat from the electronic component to the thermoelectric cooler and the cooler then transfers heat to the housing. In another embodiment, the electronic component is mounted directly in the drill pipe and the thermoelectric cooler transfers heat from the component to the drill pipe, which then transfers the heat to the drilling mud. Insulators are preferably used to prevent the unwanted transfer of heat from the housing, drill pipe, or chassis into the electronic component. Preferably, either a thermal insulator or a thermoelectric cooler is disposed adjacent each surface of the electronic component.

Figure 4:
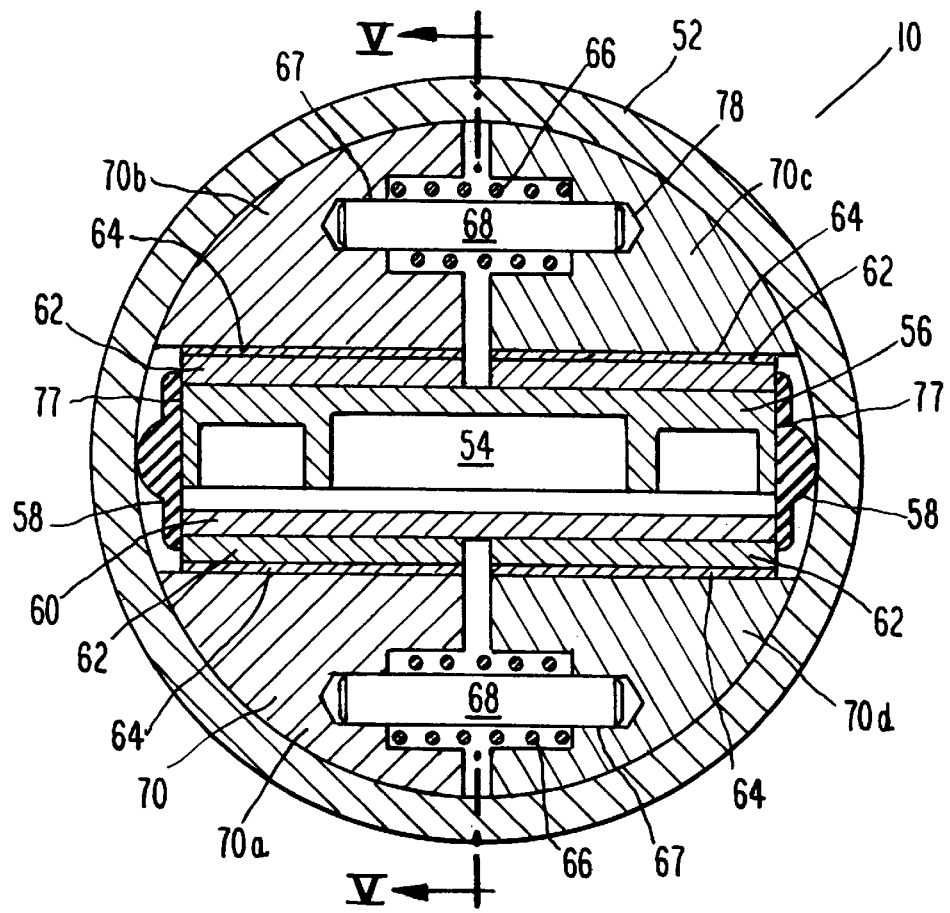
FIG. 4 is an enlarged view of a transverse cross-section of the sensor module shown in FIG. 2, showing one embodiment of a system for cooling electronic components according to the current invention.
Figure 5:
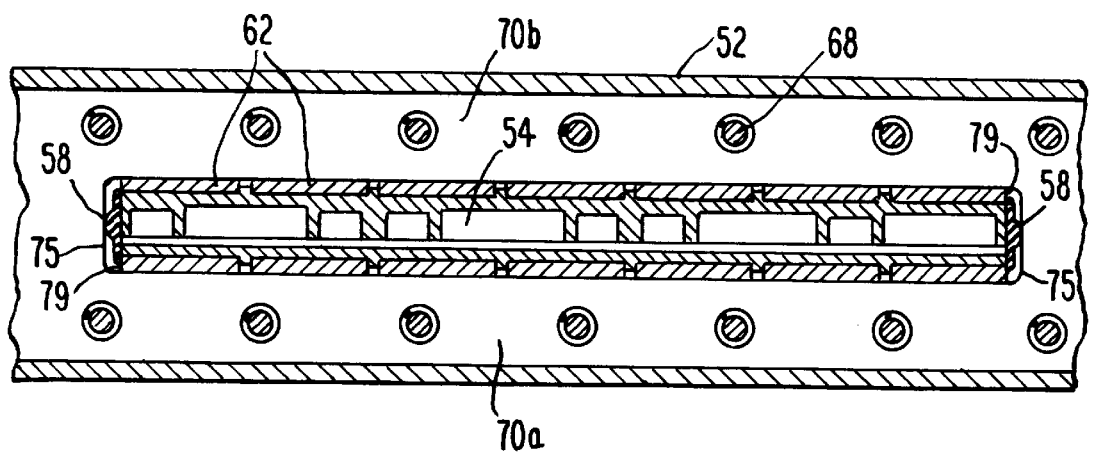
FIG. 5 is a longitudinal cross-section taken through line V—V shown in FIG. 4.

FIGS. 4–5 show one embodiment of the cooled electronic system according to the current invention. As previously discussed, the electronic component 54 may comprise a printed circuit board 49 that includes sub-components 57 and 59, for example, transistors, integrated circuits, resistors and capacitors, mounted on a substrate 55, as shown best in FIG. 4a. As is conventional, the upper surface of the printed circuit board 49 may be encapsulated in a material 56, preferably an elastomer or a resin, that provides damping, thereby protecting the sub-components against shock and vibration, and that is preferably thermally conductive. The encapsulation material also imparts stiffness to the electronic component 54. As is also conventional, the lower surface of the printed circuit board substrate 55 is mounted on a thermally conductive viscoelastic cushion 60. Suitable viscoelastic cushions 60 include silicone rubber pads such as a Series 400 pad available from Furon Thermal Management, 407 East Street, New Haven, Conn. Wires or other electrical conductors (not shown) interconnect the electronic component 54 with other components within the electrical system 8. Although all of the subcomponents for the sensor 10 shown in FIGS. 4 and 5 are shown as being encapsulated into a single electronic component 54, the invention could also be practiced by employing a number of separate electronic components, each of which may be electrically interconnected.

The electronic component 54 is mounted in a chassis 70. As shown best in FIG. 4b, in one embodiment of the invention, the chassis 70 comprises two halves that together form four elongate portions 70a, 70b, 70c, and 70d, each of which, in cross-section, forms a portion of a quadrant of a cylinder. Each chassis portion 70a–d has an internal, flat, first heat transfer surface 73, and an external, arcuate, second heat transfer surface 71 formed on its periphery. Preferably, the areas of the heat transfer surfaces 73 and 71 are as large as possible within the size constraints of the system so as to maximize the amount of heat that can be transferred across the surfaces. As discussed below, the heat transfer surfaces 73 and 71 could be formed by a conformable thermal interface material applied to the chassis body.

The chassis 70 is made from a thermally conductive material, preferably a metal, such as aluminum or copper. As used herein, the term "thermally conductive material" refers to materials having a coefficient of thermal conductivity, k, of at least 0.1 BTU/hr-ft-° F., where k is defined by the equation $H = -k \Delta T$, where H is the rate of heat conduction across a surface per unit area per unit time, and $\Delta T$ is the temperature gradient across the surface. Similarly, as used herein, the term "thermal conductor" refers to a member made substantially from thermally conductive materials. Preferably, the coefficient of thermal conductivity k of the materials used to make the chassis 70, as well as the chassis 69, 76, 86 and 88, discussed below in connection with other embodiments of the invention, is at least about 1.0 BTU/hr-ft-° F., and most preferably is at least about 20 BTU/hr-ft-° F. In embodiments of the invention that employ an insulating member, such as the insulators 58 and 78, discussed below, the thermal conductivity of the chassis should be at least twenty times, and preferably at least fifty times, greater than the thermal conductivity of the insulator.

In the embodiment shown in FIGS. 4 and 5, the electronic component 54 and its associated thermoelectric coolers 62 are mounted in the chassis 70 so that the electronic component is in direct conductive heat flow communication with the thermoelectric coolers and the thermoelectric coolers are in heat flow communication with the chassis. If desired, adhesive may be used to secure the electronic component 54 to the thermoelectric coolers 62 and to secure the thermoelectric coolers to the chassis. The chassis 70 is installed in the housing 52 so that it is in heat flow communication with both the thermoelectric coolers 62 and the housing 52.

As discussed further below in connection with FIG. 4a, each of the chassis first heat transfer surfaces 73 receives heat, by conduction, from the hot plates 46 of the thermoelectric coolers 62. The heat thus received is then transferred by conduction through the chassis 70 to the second heat transfer surfaces 71. From the surfaces 71, the heat is transferred by conduction to the inner surface 53 of the housing 52. The heat absorbed by the housing inner surface 53 is, in turn, transferred by conduction through the housing 52 to its outer surface 51, from which it is transferred by convection to the drilling mud 22 flowing through the annular passage 30 formed between the housing and the drill pipe 2.

As can be readily appreciated, high performance of the cooling system depends on good conductive heat transfer between the chassis 70 and the housing 52. Consequently, according to the current invention, a number of means may be used, either singly or in combination, to facilitate such conductive heat transfer.

Figure 6:
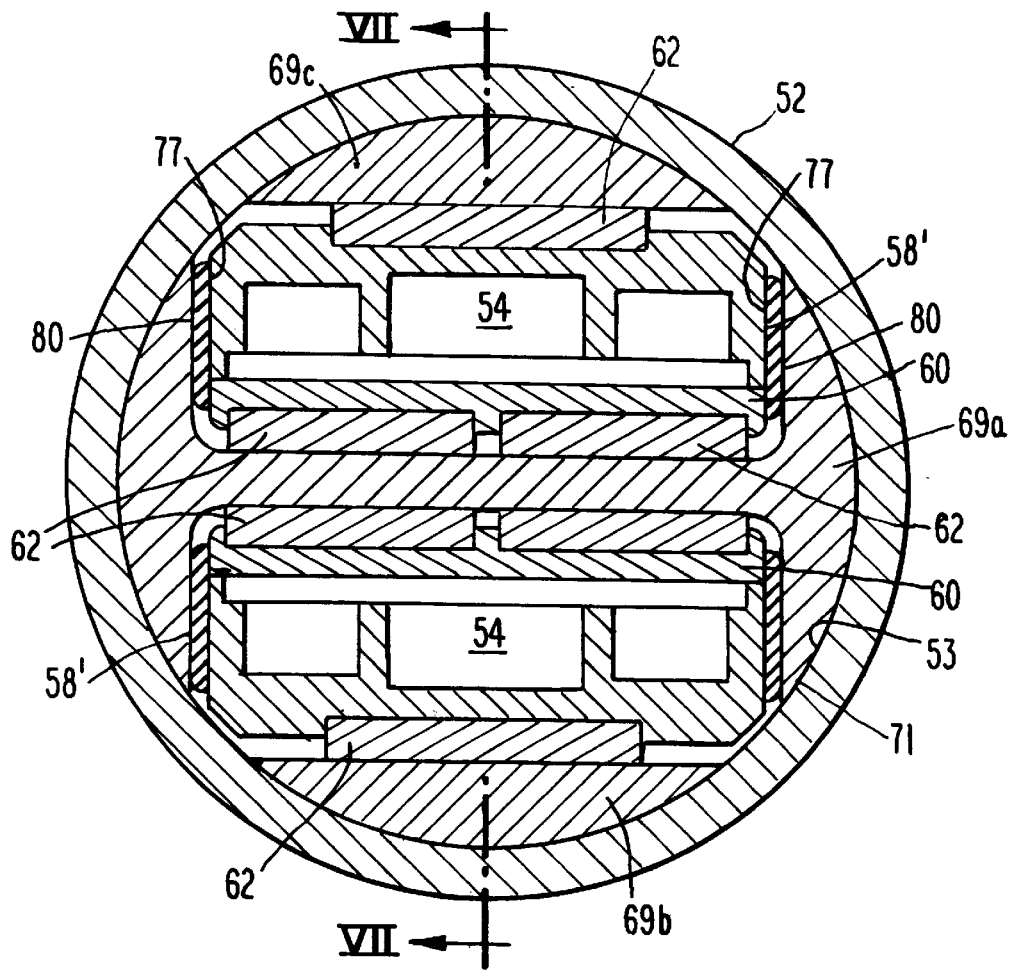
FIG. 6 is transverse cross-section similar to FIG. 4 showing another embodiment of a cooled electronic system according to the current invention.
Figure 7:
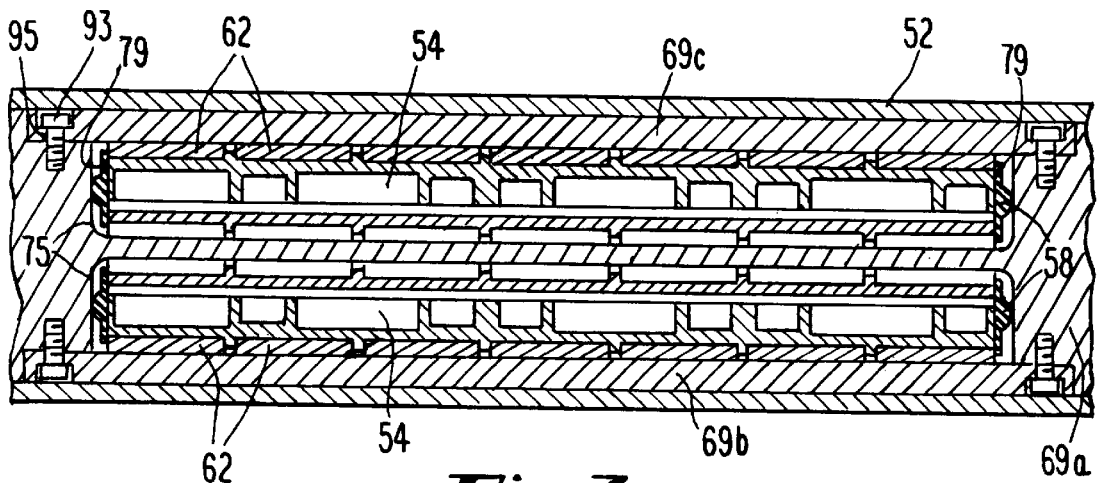
FIG. 7 is a longitudinal cross-section taken through line VII—VII shown in FIG. 6.

As illustrated in the embodiment shown in FIGS. 6–7, one means for facilitating thermal conduction between the chassis and the housing 52 is obtained by placing the peripheral surfaces 71 of the chassis and the inner surface 53 of the housing in surface contact. Practically speaking, perfect surface contact, on a microscopic level, between two surfaces is not possible. Therefore, as used herein, the term "surface contact" refers to contact in which a substantial portion of the respective heat transfer surfaces of two members are in contact, as distinguished from line or point contact, which is confined to very localized areas.

According to the current invention, a number of methods may be employed, either singly or in combination, to facilitate obtaining good surface contact between the chassis and the housing 52. One method for achieving good surface contact is to accurately machine the chassis peripheral surfaces 71 and the housing inner surface 53 to the same radius of curvature. Another method for achieving good surface contact is to make the housing 52, or at least the portions of the housing enclosing the chassis 70, flexible in compression—for example by reducing the thickness of the housing. Such flexibility will allow the high pressure gradient between outside and inside environments of the housing 52, created by the drilling mud 22, to compress the housing 53 around the chassis 70, thereby obtaining good surface contact.

Another method for achieving good surface contact is to create a force urging the chassis 70 peripheral heat transfer surfaces 71 against the housing inner surface 53. One approach for practicing this method is shown in FIGS. 4 and 5. A first pair of aligned blind holes 67 are forming in the opposing faces of two upper portions of the chassis 70b and c. A second pair of aligned blind holes 67 are forming in the opposing faces of the two lower portions of the chassis 70a and d. Guide pins 68 and springs 66, which are preferably helical compression springs, are disposed in each pair of holes 67. At assembly, the springs 66 are compressed when the chassis 70 is slid into the housing 52 so that, in operation, the springs urge the peripheral surfaces 71a–d of each chassis portion outward against its corresponding portion of the inner surface 53 of the housing 52.

Other mechanisms for urging the chassis outward toward the housing, including wedges, elastomers, and differential thermal expansion, are discussed below in conjunction with other embodiments of the invention shown in FIGS. 6–14 but could also be utilized in the embodiment shown in FIGS. 4–5.

Figure 4A:
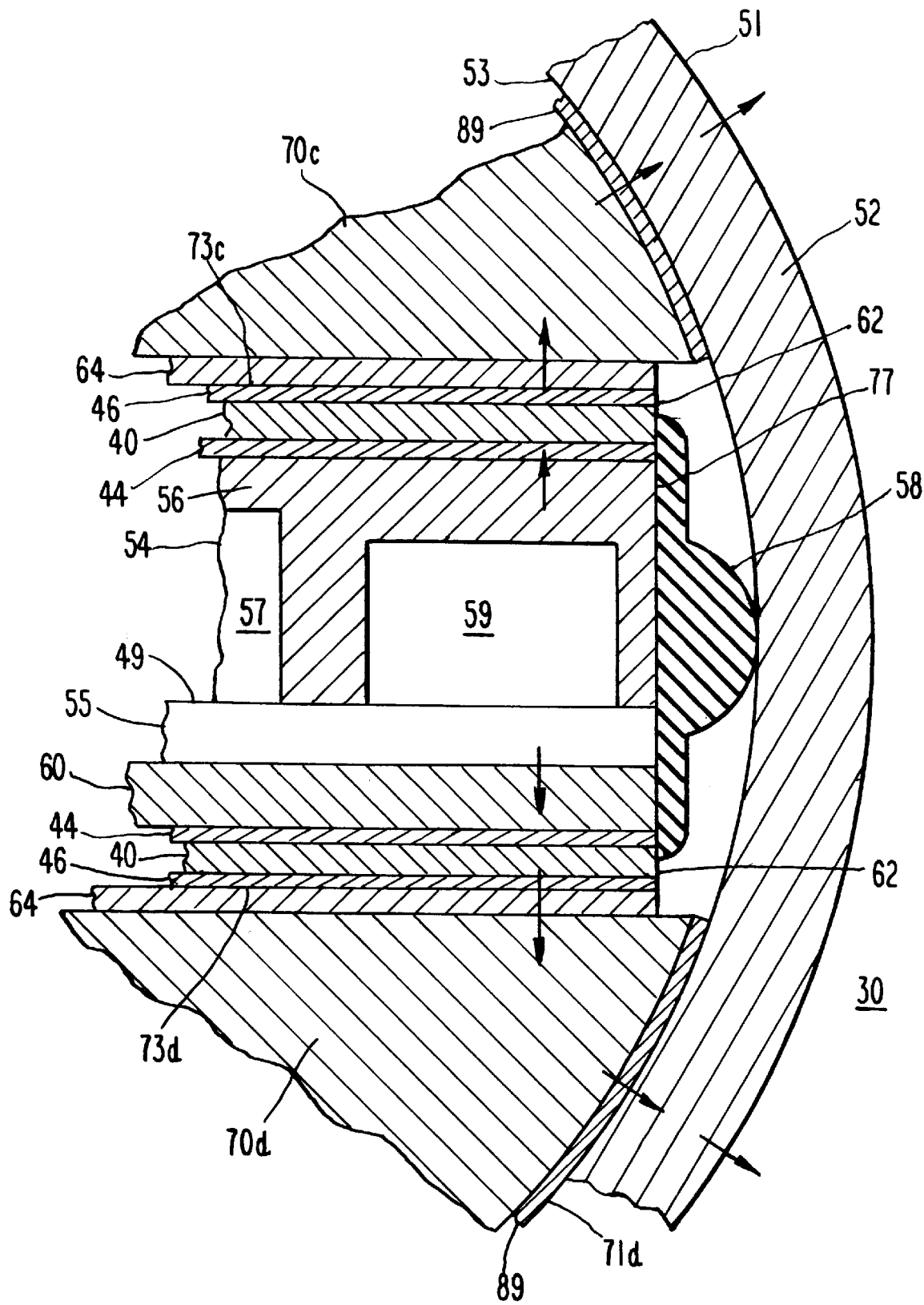
FIG. 4a is an enlarged view of a portion of FIG. 4.
Figure 4B:
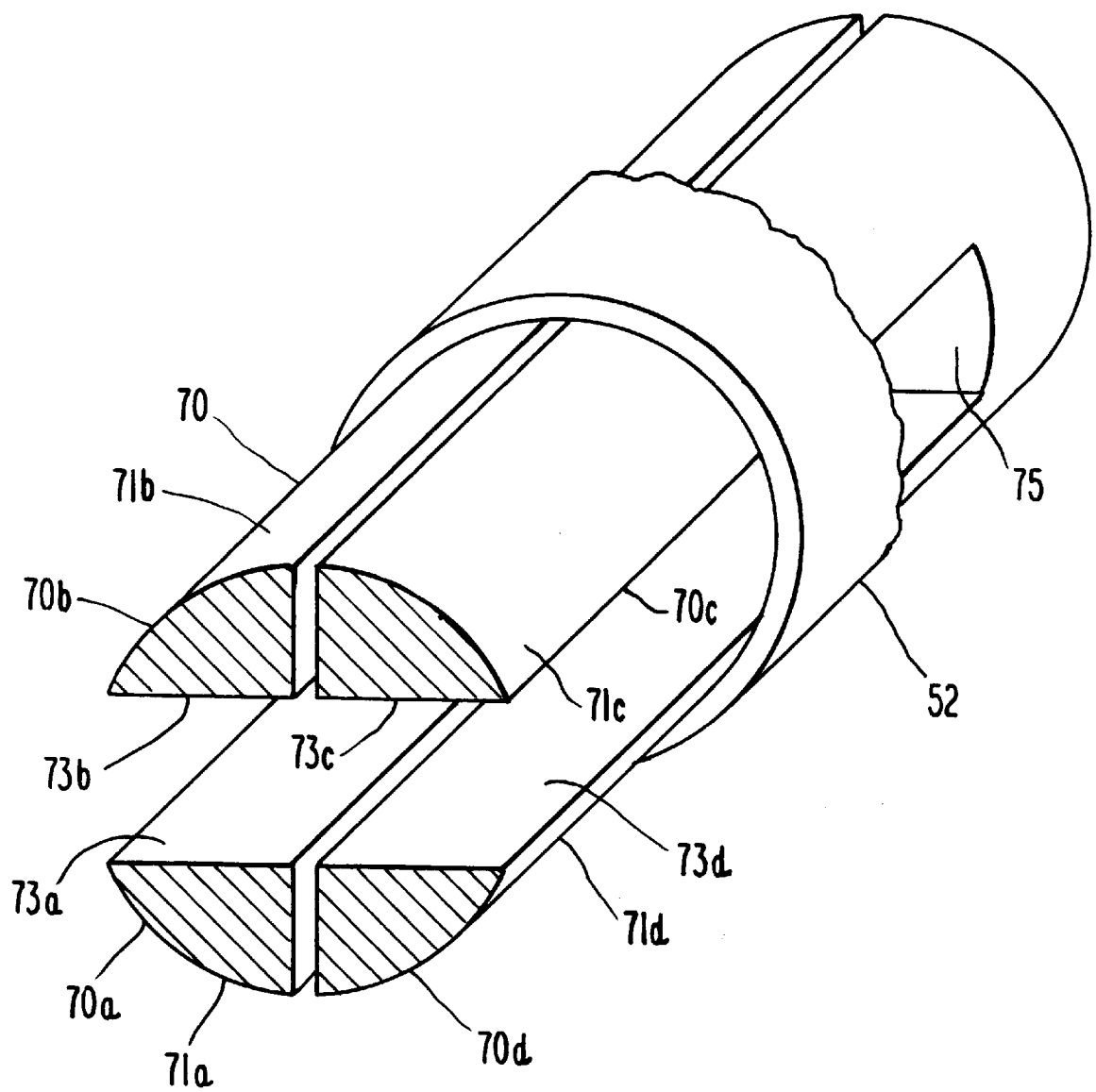
FIG. 4b is an isometric view of a transverse cross-section through the chassis shown in FIGS. 4 and 5.

Thermal conduction between the peripheral surfaces 71 of the chassis 70 and the inner surface 53 of the housing 52 can also be facilitated by incorporating a conformable thermal interface material 89 into the chassis so that the thermal interface material forms the peripheral heat transfer surfaces that contact the housing inner surface, as shown in FIG. 4a. Alternatively, the conformable thermal interface material 89 could be incorporated into the housing 52 so as to form its inner surface 53. The conformable thermal interface material 89 comprises a material layer that is sufficiently deformable under compression to conform to the surface profiles of both the chassis body and the housing inner surface 53 so as to ensure good surface contact, thereby maximizing thermal conduction. Preferably, the thermal interface material 89 is also a thermally conductive material.

Incorporation of the conformable thermal interface material into the chassis or housing aids in creating direct conductive heat flow communication between the chassis peripheral surfaces 71 and the housing inner surface 53—that is, the placement of a thermal interface material between two members does not prevent but, in fact, facilitates placing the two members in direct conductive heat flow communication as that term is used herein. Suitable thermally conductive, conformable thermal interface materials 89 include those incorporating a 2 mil thick acrylic pressure sensitive transfer adhesive, such as a TR 42 thermal adhesive material, also available from Furon Thermal Management. A Kapton™ film coated on both sides with a thermally conductive pressure sensitive adhesive, also available from Furon Thermal Management, could also be used to provide further conformability. As will be readily appreciated by those skilled in the art, a variety of other thermally conductive, thermal interface materials could also be utilized, including thermal graphite tape, thermal aluminum tape, silicone rubber coated tape, thermal grease, such as a silicone based grease, and thermal phase change material, such as Furon DuraForm C950, available from Furon Thermal Management. A thermal interface material 89 could be advantageously incorporated into the chassis 70 with, or without, a mechanism for urging the chassis toward the housing 52, such as the springs 66 discussed above.

According to one embodiment of the current invention, shown in FIGS. 4, 4a, and 5, the electronic component 54—which includes the printed circuit board 49, encapsulation material 56, and the viscoelastic cushion 60, as previously discussed—is sandwiched between upper and lower planar arrays of thermoelectric coolers 62. As depicted, each planar array consists of fourteen thermoelectric coolers 62 arranged in two rows of seven coolers each. However, depending on the application, a greater or lesser number of thermoelectric coolers, including only one thermoelectric cooler, could be utilized. Although the thermoelectric coolers 62 could be supplied with power from equipment located at the surface of the well, according to the current invention, electrical power for the thermoelectric coolers is preferably provided by the turbine alternator 16, as previously discussed, via wires (not shown) connecting it to the thermoelectric coolers.

According to a preferred embodiment of the current invention, the cold plates 44 of the thermoelectric coolers 62 in the lower planar array are in contact, preferably surface contact, with the lower surface of the electronic component 54, for example, with the lower surface of the viscoelastic cushion 60 as shown in FIG. 4a, thereby placing the cold plates in direct conductive heat flow communication with the lower surface of the electronic component 54.

As also shown in FIG. 4a, the hot plates 46 of the thermoelectric coolers 62 in the lower planar array are in direct conductive heat flow communication with the first heat transfer surfaces 73a and 73b of the lower portions 70a and 70b of the chassis 70, which, as discussed above, are preferably formed by incorporation of the thermal interface material 64 into the chassis 70. Although FIG. 4a depicts only a single stage thermoelectric cooler, the thermoelectric cooler 62 could also be of the multistage or cascade type, as previously discussed, in which case the cold plate 44 of the first thermoelectric cooler stage transferred heat through one or more intermediate thermoelectric stages to the hot plate 46 of the last thermoelectric cooler stage.

Thus, as indicated by the arrows in FIG. 4a, heat, driven by the lower array of thermoelectric coolers 62, flows by conduction from the lower surface of electronic component 54 to the cold plates 44, then to the hot plates 46, and then to the first heat transfer surfaces 73 of the chassis 70. The heat then flows by conduction through the chassis to its peripheral heat transfer surfaces 71, and then to the housing 52, as previously discussed. From the outer surface 51 of the housing 52, the heat is transferred by convection to the drilling mud 22 flowing through the annular passage 30.

Similarly, the cold plates 44 of the thermoelectric coolers 62 in the upper planar array are in contact, preferably surface contact, with the upper surface of the electronic component 54, for example, with the upper surface of the encapsulation material 56 as shown in FIG. 4a, thereby placing the cold plates in conductive heat flow communication with the upper surface of the electronic component 54. The hot plates 46 of the thermoelectric coolers 62 in the upper planar array are in conductive heat flow communication with the first heat transfer surfaces 73b and 73c of the upper portions 70b and 70c of the chassis 70, which, again, preferably employ a thermal interface material 64. As indicated by the arrows in FIG. 4a. heat from the upper surface of the electronic component 54 follows a path similar to that from the lower surface. That is, the heat flows to cold plates 44, then to the hot plates 46, then, by conduction, to the first heat transfer surfaces 73 of the chassis 70, then through the chassis by conduction, then through the chassis peripheral heat transfer surfaces 71 to the housing 52. From the housing 32, the hot flows by convection to the drilling mud 22 flowing through the annular passage 30.

As also shown in FIGS. 4–5, thermal insulators strips 58 are placed between the sides 77 and 79 of the electronic component S4 and the house 52 or chassis 70 to minimize the transfer of heat from the housing and chassis surfaces 75 into the electronic component. As used herein, the term "thermal insulating material" refers to materials or substances having a coefficient of thermal conductivity, k, defined as describe above, of less than 0.1 BTU/hr-ft-° F. Similarly, the term "thermal insulator" refers to a member made substantially from thermal insulating materials, as well as to a gap filled with a thermal insulating material, such as air. Most preferably, the material from which the thermal insulators 58 are made has a coefficient of thermal conductivity of less than 0.08-BTU/hr-ft-°F. Preferably, the thermal insulators 58 are strips of rubber.

Alternatively, thermal electric coolers, rather than insulators 58, could be placed in contact wit one or more of the side surfaces of the electronic component 54. Employing thermoelectric coolers along the sides 79 of the electronic component 54 shown in FIG. 5, instead of the thermal insulators 58, allows heat to be transferred to the chassis surfaces 75 through the side surfaces 79 of the electronic component 54. Employing thermoelectric coolers along the sides 77 of the electronic component 54 shown in FIG. 4, instead of the thermal insulators 58, allows heat to be transferred directly to the housing 52. Placement of thermoelectric coolers adjacent the sides of the electronic component could be employed Instead of, or in addition to, the placement of thermoelectric coolers adjacent the upper and lower surfaces of the electronic component. Consequently, the invention can be practiced by placing thermoelectric coolers adjacent every surface—that is, the upper, lower and all four side surfaces—of the electronic component.

In any event, preferably, either a thermal insulator 58 or a thermoelectric cooler 62 is disposed adjacent each surface of the electronic component 54. Although as depicted, the electronic component 54 has six surfaces—upper and lower surfaces and four side surfaces—the principles of the invention could be applied to electronic components having a greater or lesser number of surfaces.

Another embodiment of the invention is shown in FIGS. 6–7. In this embodiment, two electronic components 54 of the electrical system 8, such as components for the sensor modules 10, control modules 12, or pulser modules 14, as previously discussed, are enclosed within the housing 52. Each electronic component 54 is sandwiched between upper and lower planar arrays of thermoelectric coolers 62, as before.

Figure 6A:
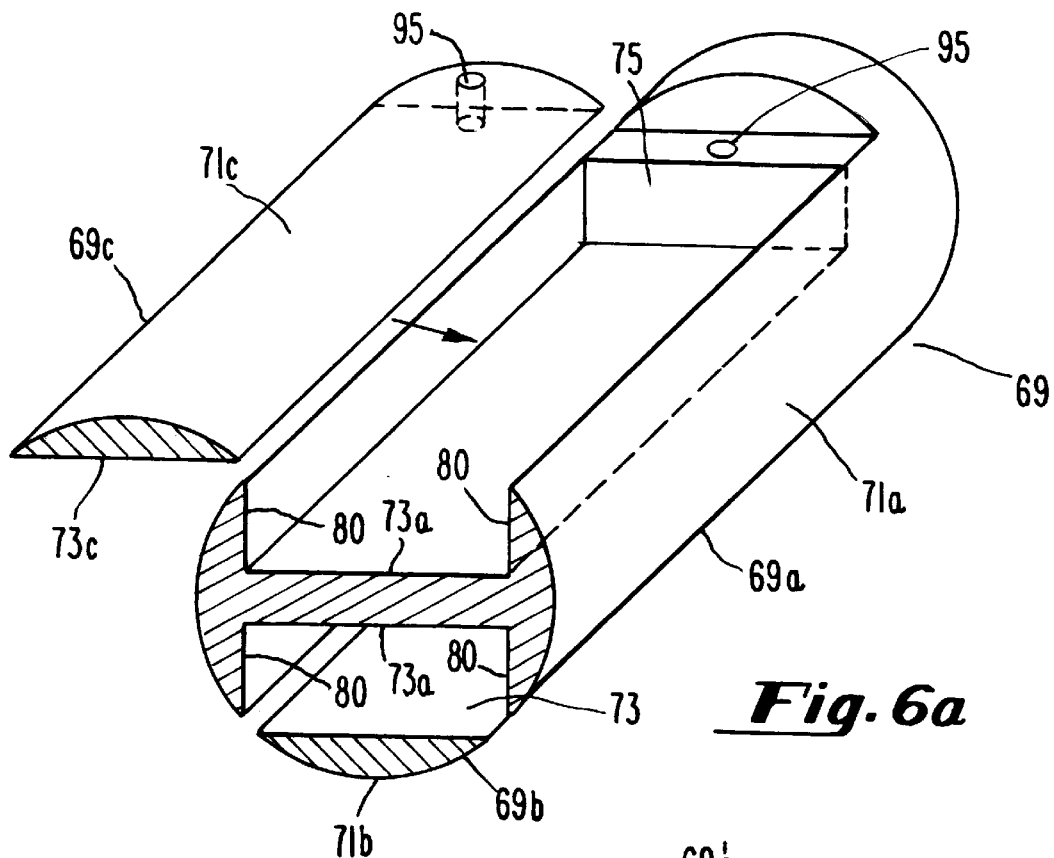
FIG. 6a is an isometric view of a transverse cross-section through the chassis shown in FIGS. 6 and 7.

In this embodiment, the thermally conductive chassis 69, shown best in FIG. 6a, is comprised of a center portion 69a and upper and lower portions 69c and 69b, respectively, that substantially surround the electronic component 54 in that there is a chassis surface opposite each surface of the electronic component. Further, the thermal interface materials and the springs for urging the chassis into contact with the housing 52 are dispensed with, relying instead on careful manufacturing of the components to provide good thermal conduction between the peripheral surfaces 71 of the chassis 69 and the housing 52.

In addition, or in the alternative, differential thermal expansion could also be utilized to urge the chassis into contact with the housing, for example, by selecting a material for the chassis 69 that had a higher coefficient of thermal expansion than the housing material. The chassis 69 is installed in the housing 52 with less clearance than that required to accommodate the differential thermal expansion so that expansion of the chassis due to heat-up in service pressed the chassis heat transfer surfaces against the housing.

As shown in FIG. 7, cap screws 93, extending through holes 95, may be used to secure the upper and lower portions 69b and c of the chassis to the center portion 69a. The cap screws 93 provide a compressive force that ensures that the thermoelectric coolers 62 are in contact with the electronic components 54 and the chassis first heat transfer surfaces 73. The center portion 69a of the chassis could be split into two halves, as discussed below in connection with the embodiments shown in FIGS. 8–14, and the side walls 80 of the chassis 69 sloped inwardly as they extended toward the first heat transfer surfaces 73. Thus, when the electronic components 54 are compressed together by the force applied by the cap screws 93, their sides act as wedges against the side walls 80 of the chassis, providing yet another method for urging the chassis halves outward toward the inner surface of the housing 53 so as to facilitate thermal conduction. Alternatively a split chassis could be utilized and the assembly installed in the housing with little or no clearance so that differential thermal expansion between the electronic components and the housing urged the chassis portions outward toward the housing inner surface.

If desired, the cap screws could be replaced with guide pins, or dispensed with altogether, and accurate manufacturing of the components or differential thermal expansion, as discussed above, relied up to ensure contact between the thermoelectric coolers and the chassis.

As depicted in FIGS. 6 and 7, the sides 77 and 79 of the electronic components 54 are covered with thermal insulators 58 and 58', as before. However, as previously discussed, thermoelectric coolers could also be placed adjacent one or more of the sides of the electronic component 54 so as to transfer heat from the side surfaces to the surfaces 75 and 80 of the chassis portion 69a. Employing thermoelectric coolers adjacent each of the surfaces 77 and 79 of the electronic component 54 would allow heat to be transferred to the chassis, via surfaces 73, 75 and 80, from all of the electronic component's surfaces. In any event, preferably, either a thermal insulator 58 or a thermoelectric cooler 62 is disposed adjacent each surface of the electronic component 54.

Figure 6B:
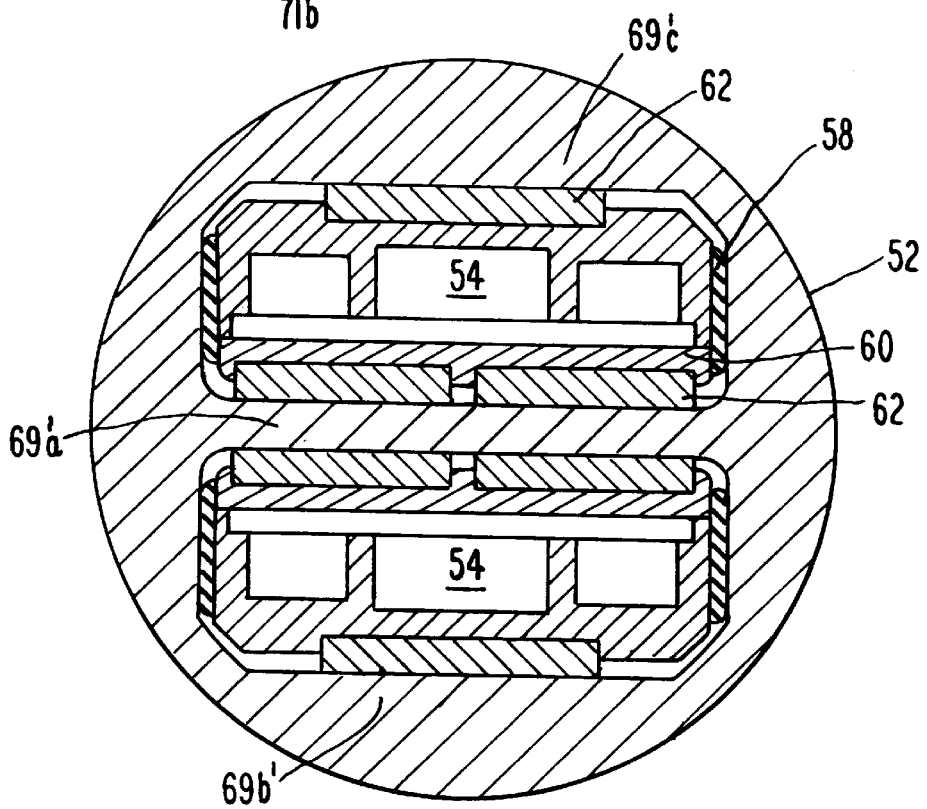
FIG. 6b is a view similar to that shown in FIG. 6 but with an alternate embodiment of the chassis.

FIG. 6b shows an alternate embodiment in which the chassis 69' is formed integrally with the housing 52. Although generally undesirable for use in most sensor modules 10, an integral chassis could be advantageously used in the various embodiments of the invention disclosed herein in connection with relatively short sensor modules.

Figure 8:
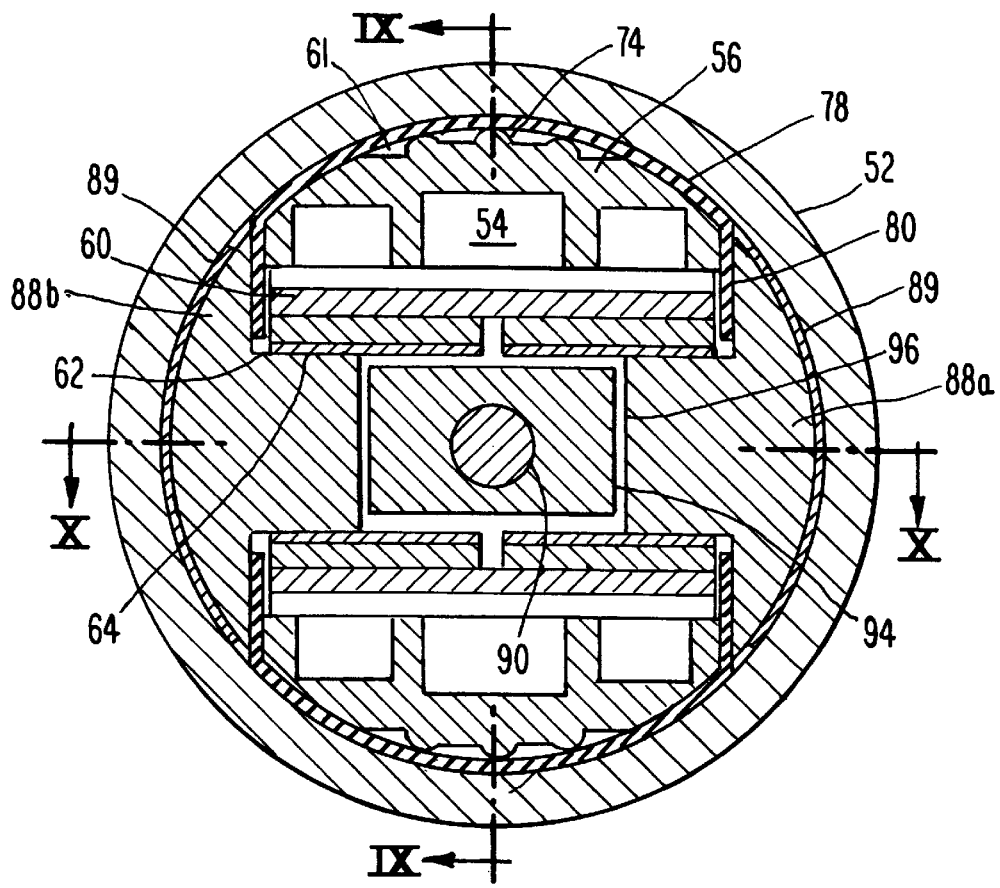
FIG. 8 is a transverse cross-section similar to FIG. 4, take along line VIII—VIII shown in FIG. 9, showing another embodiment of a cooled electronic system according to the current invention.
Figure 9:
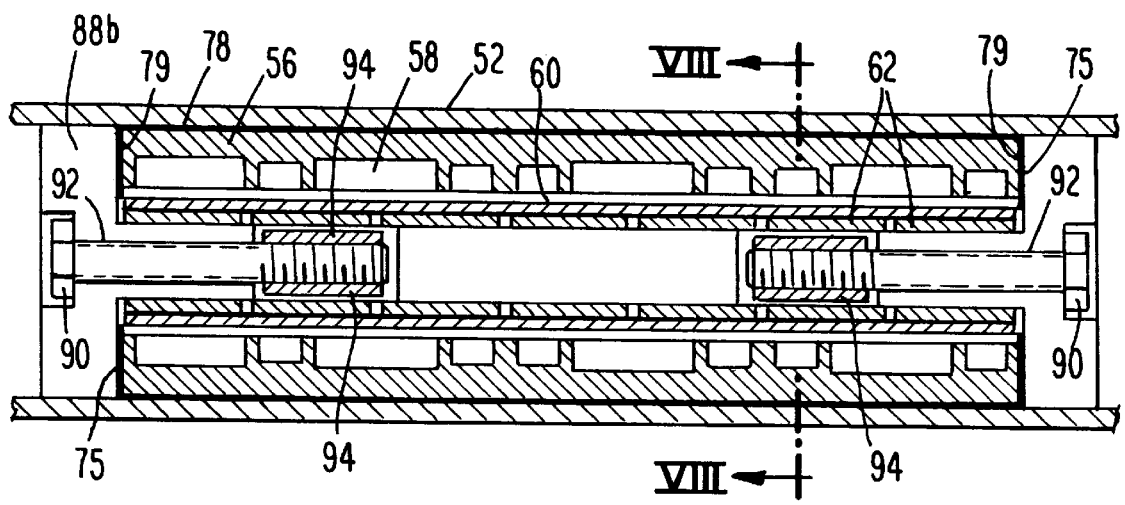
FIG. 9 is a longitudinal cross-section taken through line IX—IX shown in FIG. 8.
Figure 10:
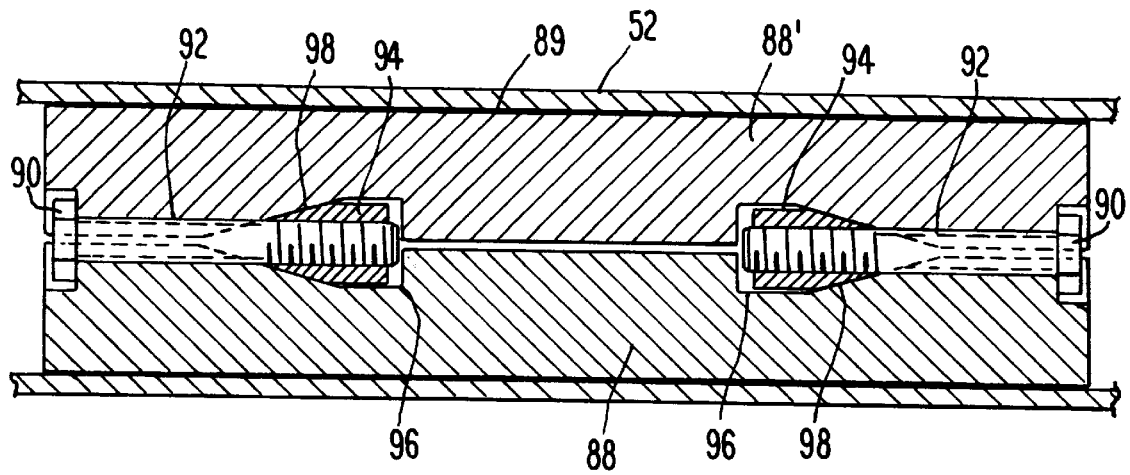
FIG. 10 is a longitudinal cross-section taken through line X—X shown in FIG. 8.

Another embodiment suitable for cooling two electronic components 54 in the same housing 52 is shown in FIGS. 8–10. As depicted, only a lower array of thermoelectric coolers 62 are juxtaposed with each electronic component 54. A layer of thermal insulating material 78, such as rubber, is placed between the upper surface of the electronic component 54 and the inner surface of the housing 53, and between the sides 77 and 79 of the electronic components and the surfaces 75 and 80 of the chassis 88, so as to reduce heat transfer from the housing 52 and the chassis 88 into the electronic component. Most preferably, the thermal insulating material 78 has a coefficient of thermal conductivity less than 0.08 BTU/hr-ft-°F. Alternatively, thermoelectric coolers could also be placed adjacent one or more of the side surfaces 77 and 79 of the electronic component so that heat was also transferred from the coolers to the surfaces 75 and 80 of the chassis 88. In any event, preferably, either thermal insulating material 78 or a thermoelectric cooler 62 is disposed adjacent each surface of the electronic component 54.

Figure 8A:
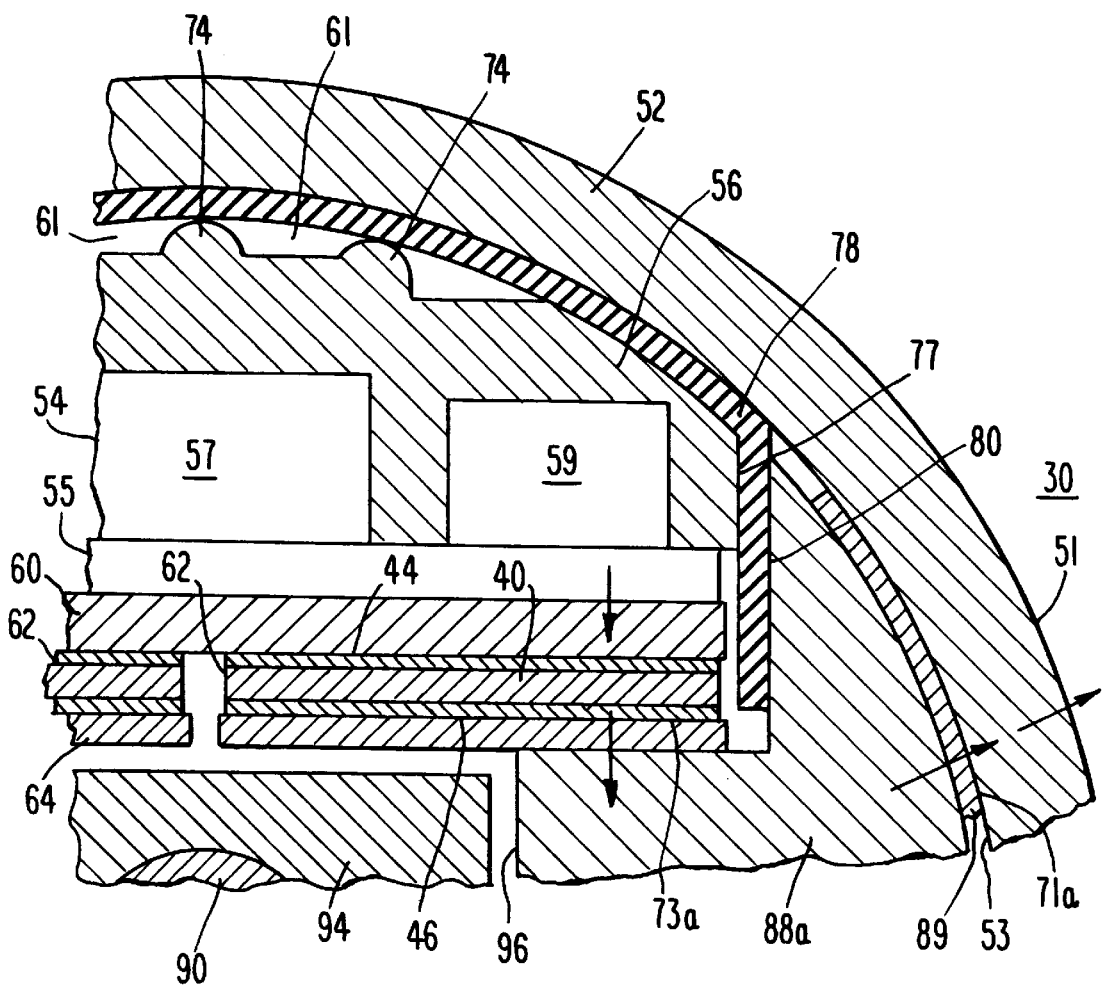
FIG. 8a is an enlarged view of a portion of FIG. 8.

Further, the encapsulation material 56 forming the upper surface of the electronic components 54, which as previously discussed may be an elastomer, preferably forms ridges 74, shown best in FIG. 8a. Each of the ridges 74 provides only line contact with the insulator 78, hereby reducing heat transfer. Although ridges 74 extending along the length of the electronic component 54 are shown, localized bumps, each of which provided point contact, could also be utilized. Gaps 61, which may be filled with air or other gas, are formed in the upper surface of the electronic component 54 between the ridges 74 and serve to retard the transfer of heat from the housing inner surface 53, thereby providing an insulating function.

Alternatively, the gaps 61 may be evacuated to reduce heat transfer. Similar to the embodiment shown in FIGS. 4–5, in the embodiment shown in FIGS. 8–10, the thermally conductive chassis 88 is split into two halves 88a and 88b. Various methods may be employed to ensure that the two chassis halves make good surface contact with the housing 52. As previously discussed in connection with the embodiment in FIGS. 4–5, springs can be used to urge the chassis halves outward.

Alternatively, as previously discussed, differential thermal expansion can be utilized to urge the chassis halves 88a and b outward. As a result of heat-up during operation, the electronic components 54 will expand, including laterally (i.e., horizontally in FIG. 8), exerting a force on the vertical walls 80 of the chassis halves so as to urge them laterally outward. This mechanism can be enhanced by selecting the materials forming the electronic component 54, for example by using an elastomeric encapsulating material 56, so that their coefficients of thermal expansion are considerably greater than the coefficient of thermal expansion of the housing material. Consequently, if the assembly is initially installed in the housing 52 with clearance that is less than that required to accommodate the differential thermal expansion that occurs between the electronic components 54 and the housing 52, the thermal expansion of the electronic components will press the chassis halves against the housing inner surface 53, thereby ensuring good contact and good thermal conduction. In this regard, the ridges 74 allow such thermal expansion to be accommodated safely since they are relatively deformable and will undergoing compressive deformation, thereby preventing excessive compressive forces from being imposed on the electronic component 54.

Figure 8B:
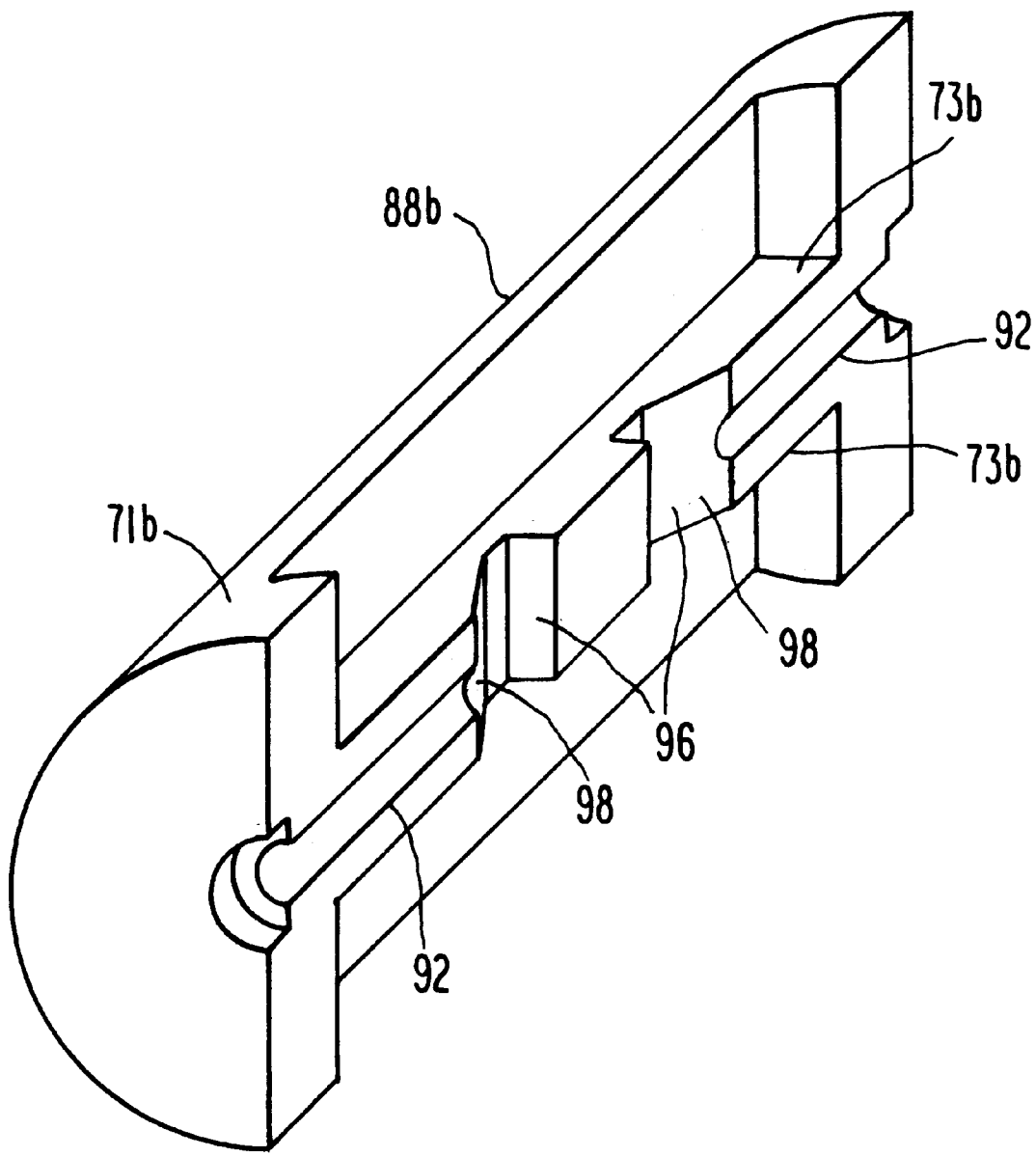
FIG. 8b is an isometric view of one half of the chassis shown in FIGS. 8–10.

In the specific embodiment shown in FIG. 8, end wedges are used to urge the chassis halves outward. As shown best in FIG. 8b. each of the chassis halves has one half of the circumference of a hole 92 formed at each of its ends. The half holes 92 connect with chassis recesses 96 that form tapered walls 98. As shown best in FIG. 10, screws 90 extend through the holes 92 and are threaded into the wedges 94. Rotation of the screws 90 pulls the wedges 94 toward the chassis ends, thereby causing the tapered sides of the wedges to engage the tapered sides 98 of the chassis recesses 96. The action of the wedges 94 urges the chassis portions outward so that their peripheral surfaces 71 are forced toward the inner surfaces 53 of the housing 52, thereby facilitating the transfer of heat between the chassis and the housing.

The heat flow path from the lower surfaces of the electronic components 54 shown in FIGS. 8–10 is similar to that previously discussed in connection with the embodiment shown in FIGS. 4–5 except that in the embodiment shown in FIGS. 8–10, all of the heat flows from each electronic component through only one planar array of thermoelectric coolers 62. As shown best in FIG. 8a, heat from the upper electronic component 54 is transferred by the array of thermoelectric coolers 62 from the lower surface of the electronic component to the first heat transfer surfaces 73a of the chassis 88. Heat then flows by conduction though the chassis to its peripheral heat transfer surfaces 71a and then into the inner surface 53 of the housing 52. The heat flows to the housing outer surface 51 and then, by convection, to the drilling mud 22 as before. A similar heat flow path occurs with respect to the bottom electronic component. As also previously discussed, although it is desirable to utilize the thermal interface materials 64 and 89 in many situations, this embodiment, as well as the other embodiments of the invention, could be practiced without them, for example, by relying on accurate manufacturing.

Figure 11:
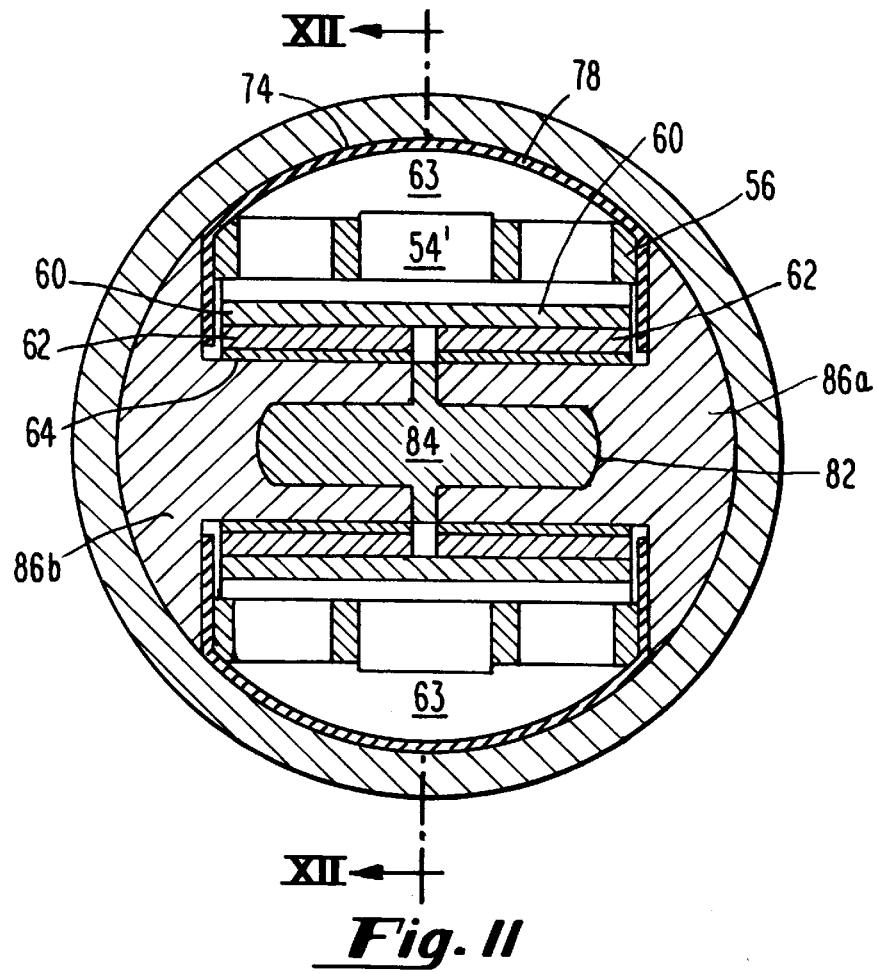
FIG. 11 is transverse cross-section similar to FIG. 4 showing another embodiment of a cooled electronic system according to the current invention.
Figure 12:
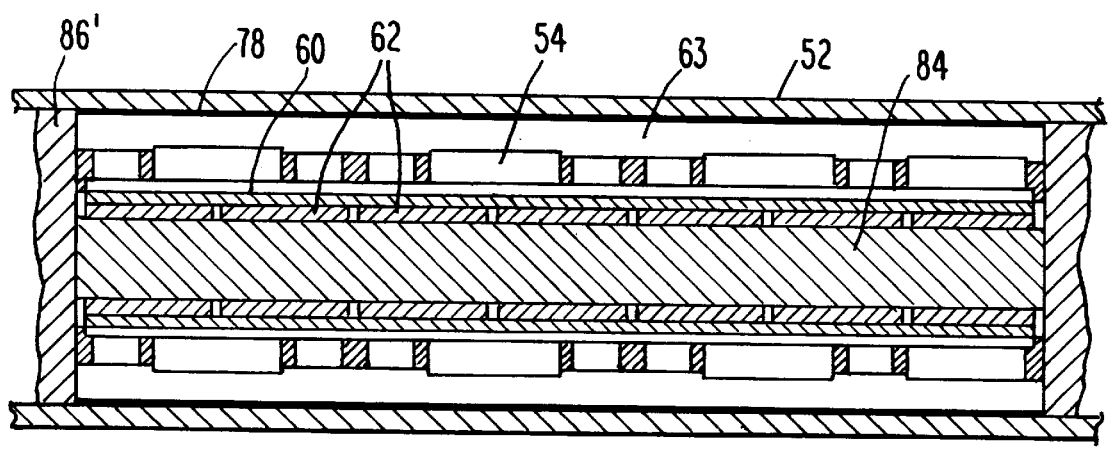
FIG. 12 is a longitudinal cross-section taken through line XII—XII shown in FIG. 11.
Figure 11A:
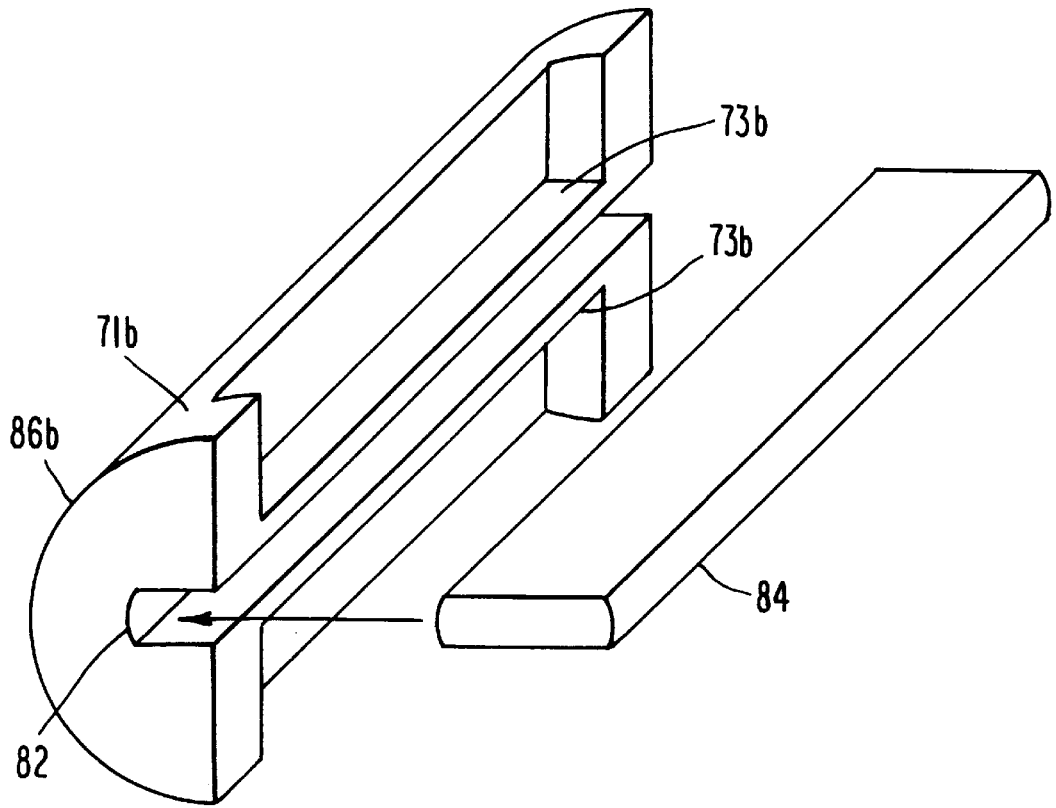
FIG. 11a is an isometric view of one half of the chassis shown in FIGS. 11–12.

The embodiment shown in FIGS. 11–12 is similar to that shown in FIGS. 8–10 except that the means for urging the chassis halves 86a and b outward toward the inner surface 53 of the housing 52 comprises a deformable member 84 disposed in a slot 82 formed in opposing faces of the chassis halves. The deformable member 84 may be an elastomeric material that is compressed when the assembly is placed within the housing 52 so that it exerts an outward force on the chassis halves.

Alternatively, the deformable member 84 could be injected into the slot 82 after the chassis is installed in the housing 52. Preferably, the thermal coefficient of the deformable member 84 is greater than that of the chassis and the housing materials so that differential thermal expansion due to heat up during operation will cause the deformable member 82 to urge the chassis halves outward.

In addition, in the embodiment shown in FIGS. 11–12, the encapsulation material 56 does not extend beyond the subcomponents of the electronic component so that a gap 63, filled with air or other gas, is formed between the upper surface of the electronic component 54' and the housing 52, thereby forming an insulator. Alternatively, the gap 63 could be evacuated to reduce heat transfer.

Figure 13A:
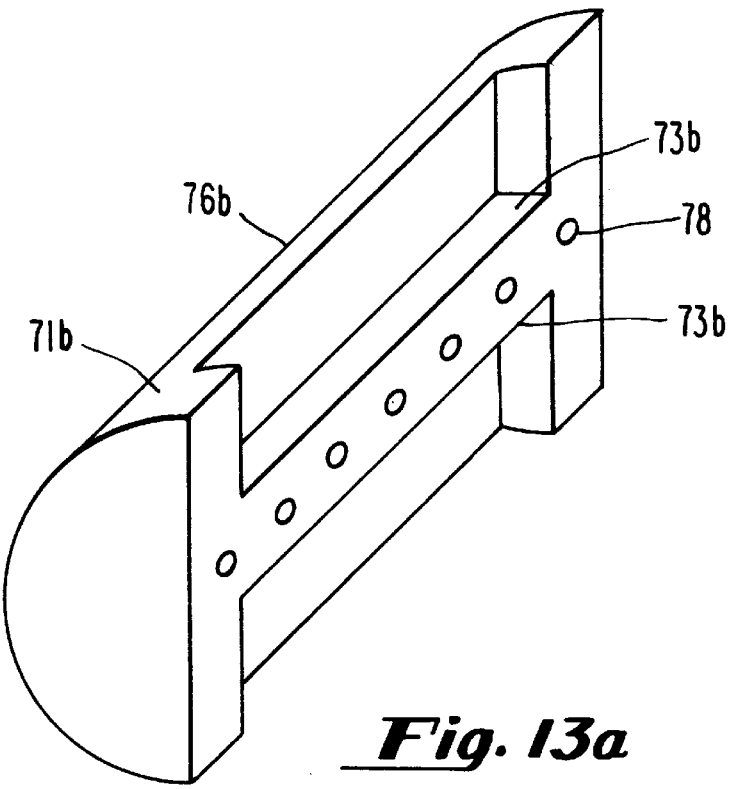
FIG. 13a is an isometric view of one half of the chassis shown in FIGS. 13 and 14.
Figure 13:
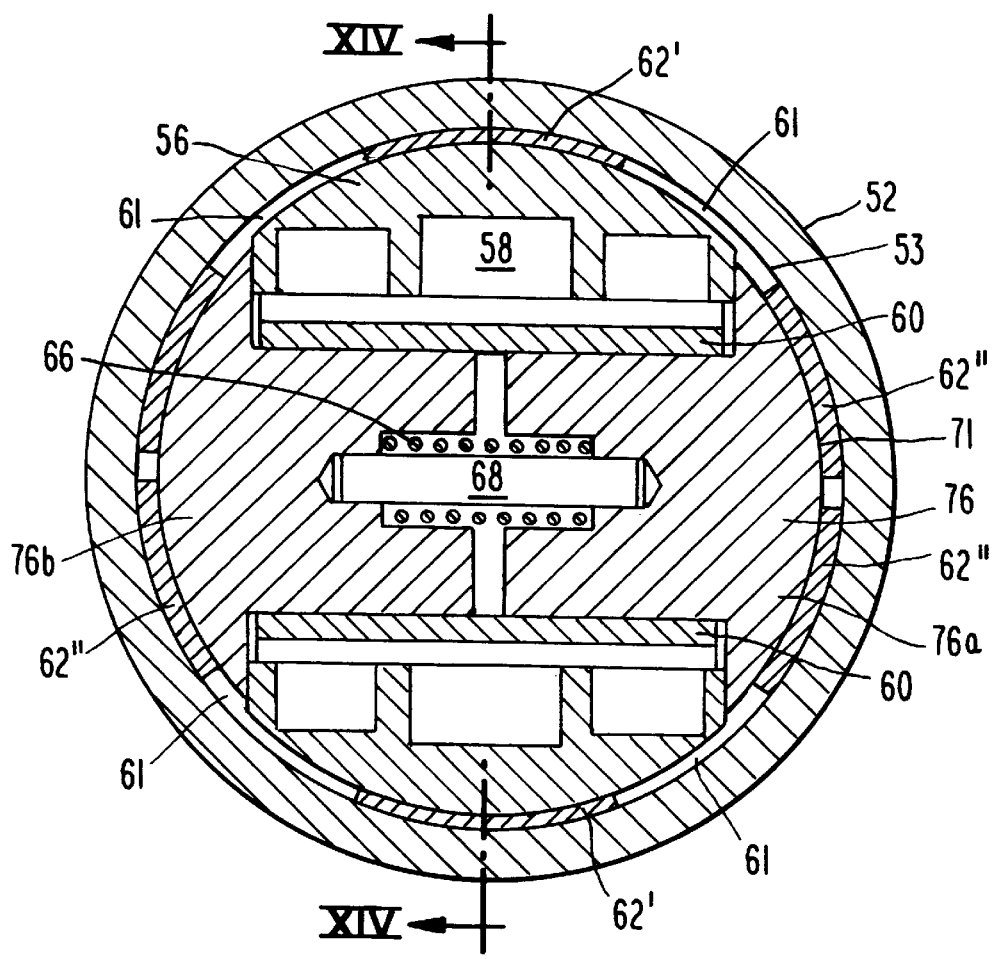
FIG. 13 is transverse cross-section similar to FIG. 4 showing another embodiment of a cooled electronic system according to the current invention.
Figure 14:
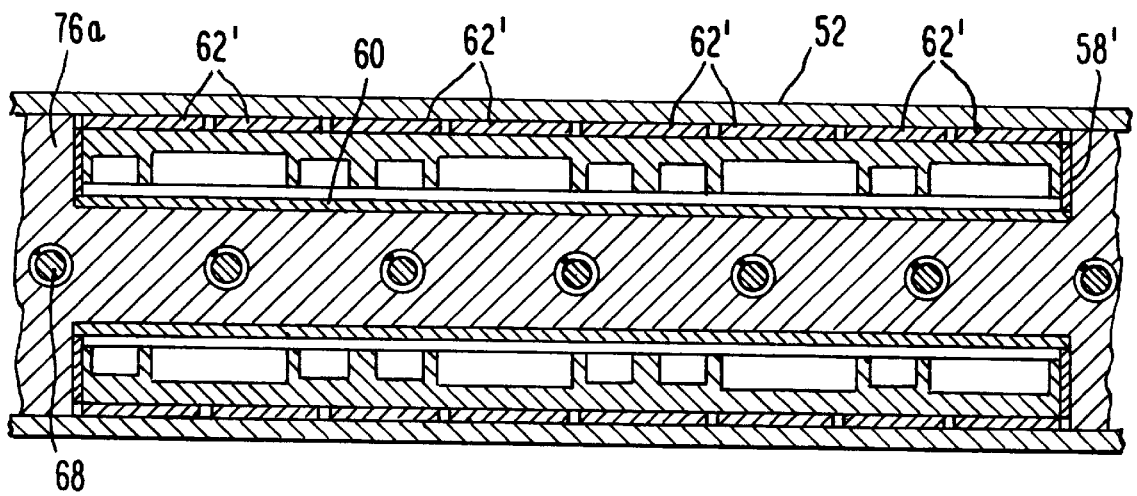
FIG. 14 is a longitudinal cross-section taken through line XIV—XIV shown in FIG. 13.

The embodiment shown in FIGS. 13 and 14 illustrate additional cooling configurations according to the current invention that employ arcuate shaped thermoelectric coolers. According to one configuration, arcuate the thermoelectric coolers 62' are mounted between the upper surfaces of the electronic components 58 and the inner surface 53 of the housing 52 so that the thermoelectric coolers' cold plates are in surface contact with the upper surfaces of the electronic components and their hot plates are in surface contact with the housing inner surface 53. Such surface contact could be facilitated by incorporating a conformable thermal interface material 89, such as that discussed above and shown in FIGS. 4a and 8a, into the hot or cold plates of the thermoelectric coolers 62', the upper surfaces of the electronic components 58, or the inner surface 53 of the housing 52, thereby enhancing heat conduction.

In this configuration, the arcuate thermoelectric coolers 62' transfer heat directly to the housing 52 without the use of an intermediate thermally conductive chassis. Consequently, although a chassis 76, shown best in FIG. 13a, may be used for mounting purposes, it need not be thermally conductive and, in fact, is preferably made from a thermal insulating material if other thermoelectric coolers, such as the thermoelectric coolers 62' discussed below, are not utilized. As an alternative to making the chassis 76 from an insulating material, insulators could be placed between the chassis peripheral surfaces 71 and the housing inner surface 53 in place of the coolers 62" to retard heat flow from the housing into the chassis. Also, insulators comprising air gaps 61 may be formed between portions of the electronic components 58, or the chassis peripheral surfaces 71, and the housing inner surface 53 to retard heat transfer into the electronic component.

Although as shown in FIGS. 13 and 14, the electronic component 58 is mounted directly onto the chassis 76 without any intervening thermoelectric coolers, if desired, thermoelectric coolers 62 could be mounted between the lower surface of the electronic component 58 and the chassis 76, as discussed above in connection with the embodiments shown in FIGS. 8 and 11, for example, so that heat was also transferred from the lower surfaces of the electronic components to the housing 52 by means of the chassis, as well as being transferred directly to the housing by the arcuate thermoelectric coolers 62'. In that event, the chassis 76 should be made substantially from thermally conductive materials, as before, and no insulators should be inserted between the chassis and the housing.

As shown in FIGS. 13 and 14, arcuate thermoelectric coolers 62" may be mounted between the chassis peripheral heat transfer surfaces 71 and the inner surface of the housing 52. When thermoelectric coolers are used in this manner, heat is first transferred from the electronic components 58 to the thermally conductive chassis 76 and then transferred from the chassis to the housing 52 by the thermoelectric coolers 62". Again, a conformable thermal interface material 89, such as that discussed above and shown in FIGS. 4a and 8a, can be incorporated into the chassis peripheral heat transfer surfaces 71 or the housing inner surface 53, or into the hot or cold plates of the thermoelectric coolers 62', to ensure good surface contact and, therefore, good heat conduction. Also, any of the methods for urging the chassis peripheral surfaces 71 toward the housing inner surface previously discussed, such as the pins 68 and springs 66 shown in FIGS. 13 and 14, as well as the wedges, deformable member or differential thermal expansion previously discussed, could be utilized to ensure good surface contact and good heat conduction.

The invention could be practiced using only the arcuate thermoelectric coolers 62" disposed between the chassis peripheral surfaces 71 and the housing 52. Alternatively, coolers 62" could be used in addition to the arcuate thermoelectric coolers 62' disposed directly between the electronic component 54 and the housing 52, as shown in FIG. 13, so that heat was transferred directly to the housing as well as to the housing by means of the chassis.

In still another alternative, the coolers 62" could be used in conjunction with thermoelectric coolers 62 disposed between the electronic components 58 and the chassis heat transfer surfaces 73, as discussed in connection with the embodiments shown in FIGS. 4–12, thereby utilizing both thermoelectric coolers 62 between the electronic component 58 and the chassis 76 to facilitate the transfer of heat from the electronic component to the chassis, and between the chassis and the housing 52 to facilitate the transfer of heat from the chassis to the housing In the embodiment shown in FIGS. 13 and 14, thermoelectric coolers are used between the chassis and the housing by making the coolers arcuate. However, a similar arrangement could be practiced with flat thermoelectric coolers by, for example, employing an additional thermal conductor having a flat surface on one side and an arcuate surface on the other side, such as chassis portion 69c shown in FIG. 6, between the hot plate of the thermoelectric cooler and the housing so that the thermoelectric cooler was sandwiched between two chassis portions. The first chassis portion transfers heat from the electronic component to the thermoelectric cooler while the second chassis portion transfers heat from the thermoelectric cooler to the housing.

Although two electronic components 54 are shown in FIGS. 8–14, the embodiment shown therein could also be practiced using only one electronic component or adapted for more than two electronic components.

Figure 15:
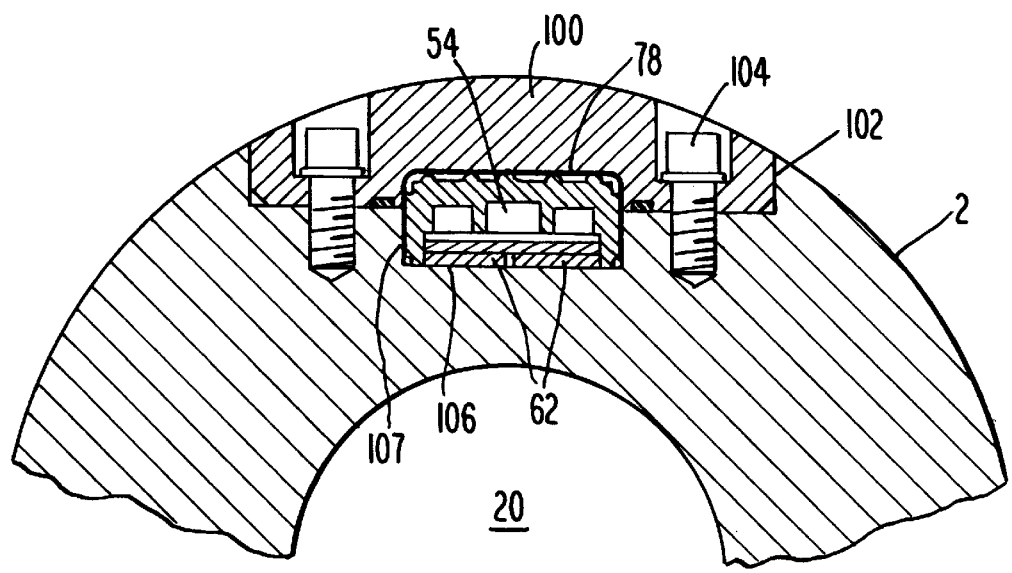
FIG. 15 is a transverse cross-section taken along line XV—XV shown in FIG. 1 showing a portion of the drill pipe of the downhole assembly containing another embodiment of a cooled electronic system according to the current invention.

As shown in FIG. 15, the electronic component 54 cooled according to the current invention could also be installed in the drill pipe 2, rather than a housing 52 within the drill pipe, and connected to the remainder of the electrical system by an electrical conductor 26. In this embodiment, an array of thermoelectric coolers 62 are disposed between, and preferably placed in contact with, the lower surface of the electronic component 54 and a heat transfer surface 106 formed within a cavity 107 in the drill pipe 2. Thus, the thermoelectric coolers are in conductive heat flow communication with the drill pipe 2. The heat transferred to the drill pipe 2 is then transferred by convection to the drilling mud 22 flowing within the drill pipe passage 20 and/or the drilling mud 23 flowing through the annular passage formed between the outer surface of the drill pipe and the bore 4, shown in FIG. 1. A cover portion 100, secured by screws 104 to the remainder of the drill pipe 2, protects the electronic component 54. A layer of thermal insulating material 78, as previously discussed, is placed between the upper surface of the electronic component 54, which features ridges as also previously discussed, and the cover 100 to reduce heat transfer from the cover into the electronic component.

Alternatively, the thermoelectric cooler 62 and electronic component 54 could be inverted from the manner depicted in FIG. 15 so that the thermoelectric cooler was in heat transfer communication with the inner surface of the cover portion 100 of the drill pipe 2.

As can be appreciated, the various embodiments of the current invention provide highly effective configurations for cooling an electrical system in a downhole assembly that incorporates thermoelectric coolers yet is compact and durable and sufficiently rugged to withstand the shock and vibration to which downhole assemblies are subjected. In addition, the configurations afford high rates of conductive heat transfer so as to maximize the usefulness of the thermoelectric coolers. For example, a thermoelectric cooler 62 of the two stage, cascade type can achieve a temperature difference between its hot and cold plates of about 45° C. Theoretical calculations show that employing such a thermoelectric cooler in an embodiment of the type shown in FIGS. 8–10, for example, but with only a single electronic component 54, and in which, due to the conditions in the formation, the temperature of the drilling mud 22 is 206° C., can result in the temperature of the electronic component 54 being maintained at about 175° C. The temperature of the adjoining cold plate would be 165° C. while the temperature of the hot plate would be 210° C. The temperature of the chassis would be 205° C. and the temperature of the housing 202° C.

Although the current invention has been illustrated in connection with an electrical system in a downhole assembly the principles of the invention could also be utilized in other portions of a drill string requiring the cooling of electronic components or in other devices employing electronic components within a well, such as devices for logging existing wells. Nor is the invention limited to the cooling of electronic components that comprises a printed circuit board. Accordingly, the present invention may be embodied in other specific forms without departing from the spirit or essential attributes thereof and, accordingly, reference should be made to appended claims, rather than to the foregoing specification, as indicating the scope of the invention.

What is claimed:

1. A cooled electronic system for use downhole in a drill string through which a drilling fluid flows, said cooled electronic system comprising:
    a) a housing adapted to be disposed within said drill string, whereby said drilling fluid flows over said housing;
    b) at least first and second thermoelectric coolers enclosed by said housing, each of said first and second thermoelectric coolers comprising (i) a hot plate on one side thereof, (ii) a cold plate on another side thereof, and (iii) means for transferring heat from said cold plate to said hot plate;
    c) a first electronic component having first and second surfaces, said first electronic component enclosed by said housing and sandwiched between said first and second thermoelectric coolers, said first and second thermoelectric coolers oriented so that their respective cold plates are in heat flow communication with said first and second surfaces, respectively, of said first electronic component, whereby each of said cold plates receives heat from said first electronic component and transfers said received heat to its respective hot plate; and
    d) a thermally conductive chassis in which said sandwich of said electronic component and said thermoelectric coolers is mounted, said chassis having first, second and third heat transfer surfaces, said chassis first heat transfer surface in heat flow communication with said hot plate of said first thermoelectric cooler, said chassis second heat transfer surface in heat flow communication with said hot plate or said second thermoelectric cooler, said chassis third heat transfer surface in heat flow communication with said housing, whereby said chassis conducts heat from said hot plates of said first and second thermoelectric coolers to said housing, and whereby said housing transfers heat to said drilling fluid flowing over said housing.

2. The cooled electronic system according to claim 1, further comprising means for placing said chassis third heat transfer surface in direct conductive heat flow communication with said housing.

3. The cooled electronic system according to claim 2, wherein said direct conductive heat flow communication means comprises means for urging said chassis third heat transfer surface into contact with said housing.

4. The cooled electronic system according to claim 3, wherein said contact urging means comprises means for placing said chassis third heat transfer surface into surface contact with said housing.

5. The cooled electronic system according to claim 3, wherein said contact urging means comprises an elastically deformable member exerting a force on said chassis.

6. The cooled electronic system according to claim 5, wherein said chassis comprises first and second portions, said deformable member urging said first and second chassis portions apart.

7. The cooled electronic system according to claim 5, wherein said elastically deformable member comprises a spring.

8. The cooled electronic system according to claim 5, wherein said elastically deformable member is formed from an elastomeric material.

9. The cooled electronic system according to claim 3, wherein said contact urging means comprises a wedge exerting a force against said chassis.

10. The cooled electronic system according to claim 2, wherein said housing has an inside surface, and wherein said direct conductive heat flow communication means comprises said chassis third heat transfer surface conforming to at least a portion of said inside surface of said housing and being in surface contact therewith.

11. The cooled electronic system according to claim 2, wherein said chassis comprises a body portion and a conformable layer, said conformable layer forming said third heat transfer surface, and wherein said housing has a surface, and wherein said direct conductive heat flow communication means comprises said conformable layer having a surface substantially conforming to said housing surface.

12. The cooled electronic system according to claim 1, wherein either a thermoelectric cooler or a thermal insulator is disposed adjacent each surface of said electronic component so that none of the surfaces of said electronic component have neither an insulator or a thermoelectric cooler disposed adjacent therewith.

13. The cooled electronic system according to claim 1, wherein said cold plate of said first thermoelectric cooler is in conductive heat flow communication with said first surface of said first electronic component, and wherein said cold plate of said second thermoelectric cooler is in conductive heat flow communication said second surface of said first electronic component.

14. The cooled electronic system according to claim 13, wherein said cold plate of said first thermoelectric cooler is in surface contact with said first surface of said first electronic component, said cold plate of said second thermoelectric cooler is in surface contact with said second surface of said first electronic component.

15. The cooled electronic system according to claim 1, wherein said chassis first and second heat transfer surfaces are in surface contact with said hot plates of said first and second thermoelectric coolers, respectively.

16. The cooled electronic system according to claim 1, further comprising a thermal insulator, and wherein said first electronic component has a third surface, said thermal insulator being disposed between said third surface of said first electronic component and said housing.

17. The cooled electronic system according to claim 1, further comprising:
   a) third and fourth thermoelectric coolers, each of said third and fourth thermoelectric coolers comprising (i) a hot plate on one side thereof, (ii) a cold plate on another side thereof, and (iii) means for transferring heat from said cold plate to said hot plate;
   b) a second electronic component sandwiched between said third and fourth thermoelectric coolers, each of said third and fourth thermoelectric coolers oriented so that its respective cold plate is in heat flow communication with said second electronic component, whereby each of said cold plates receives heat from said second electronic component and transfers said received heat to its respective hot plate; and
   c) and wherein said thermally conductive chassis has fourth and fifth surfaces, said chassis fourth surface in heat flow communication with said hot plate of said third thermoelectric cooler, said chassis fifth surface in heat flow communication with said hot plate of said fourth thermoelectric cooler, whereby said chassis also conducts heat from said hot plates of said third and fourth thermoelectric coolers to said housing, and whereby said housing transfers said heat from said third and fourth thermoelectric coolers to said drilling fluid flowing over said housing.

18. The cooled electronic system according to claim 1, wherein said first and second thermoelectric coolers are electrically powered, and further comprising means for generating electricity for powering said first and second thermoelectric coolers, said electricity generating means disposed within said housing and driven by said drilling fluid.

19. The cooled electronic system according to claim 18, wherein said electricity generating means comprises a turbine located in said drill string so that said drilling fluid flows through and drives said turbine.

20. The cooled electronic system according to claim 1, wherein said chassis is integrally formed with said housing.

21. A cooled electronic system for use downhole in a drill string through which a drilling fluid flows, said cooled electronic system comprising:
   a) a housing adapted to be disposed within said drill string, whereby said drilling fluid flows over said housing;
   b) at least a first thermoelectric cooler, said fast thermoelectric cooler comprising (i) a hot plate on one side thereof, (ii) a cold plate on another side thereof, and (iii) means for transferring heat from said cold plate to said hot plate;
   c) a first electronic component, said first electronic component having at least a first surface, said first surface of said first electronic component being in heat flow communication with said cold plate of said first thermoelectric cooler, whereby said cold plate receives heat from said first electronic component and transfers said received heat to said hot plate; and
   d) a thermal conductor having first and second heat transfer surfaces, said first heat transfer surface of said thermal conductor being in heat flow communication with said hot plate, said second heat transfer surface of said thermal conductor being in heat flow communication with said housing, whereby said thermal conductor conducts heat from said hot plate to said housing, and whereby said housing transfers heat to said drilling fluid flowing over said housing.

22. The cooled electronic system according to claim 21, wherein said thermal conductor is in contact with and extends between said hot plate of said first thermoelectric cooler and said housing.

23. The cooled electronic system according to claim 21, wherein said thermal conductor comprises a chassis on which said first electronic component and said first thermoelectric cooler are mounted.

24. The cooled electronic system according to claim 21, wherein said first electronic component has a second surface, and further comprising an insulator covering said second surface of said first electronic component and disposed between said second surface of said first electronic component and said housing.

25. The cooled electronic system according to claim 24, wherein the thermal conductivity of said thermal conductor is at least twenty times greater than the thermal conductivity of said insulator.

26. The cooled electronic system according to claim 21, further comprising means for placing said thermal conductor second heat transfer surface and said housing in direct conductive heat flow communication.

27. The cooled electronic system according to claim 26, wherein said direct conductive heat flow communication means comprises means for urging said second heat transfer surface of said thermal conductor into contact with said housing.

28. The cooled electronic system according to claim 27, wherein said contact urging means comprises means for urging said thermal conductor second heat transfer surface into surface contact with said housing.

29. The cooled electronic system according to claim 27, wherein said contact urging means comprises an elastically deformable member exerting a force on said thermal conductor.

30. The cooled electronic system according to claim 29, wherein said thermal conductor comprises first and second portions, and wherein said deformable member urges said first and second thermal conductor portions apart.

31. The cooled electronic system according to claim 29, wherein said elastically deformable member comprises a spring.

32. The cooled electronic system according to claim 29, wherein said elastically deformable member comprises an elastomer.

33. The cooled electronic system according to claim 27, wherein said contact urging means comprises a wedge.

34. The cooled electronic system according to claim 27, wherein said electronic component is formed substantially from a material having a first coefficient of thermal expansion, and wherein said housing is formed substantially from a material having a second coefficient of thermal expansion, and wherein said contact urging means comprises said first coefficient of thermal expansion being greater than said second coefficient of thermal expansion, whereby thermal expansion of said electronic component exerts a force on said thermal conductor.

35. The cooled electronic system according to claim 26, wherein said housing has an inside surface, and wherein said direct conductive heat flow communication means comprises said thermal conductor third heat transfer surface conforming to at least a portion of said inside surface of said housing and being in surface contact therewith.

36. The cooled electronic system according to claim 26, wherein said thermal conductor comprises a body portion and a conformable layer, said conformable layer forming said third heat transfer surface, and wherein said housing has a surface, and wherein said direct conductive heat flow communication means comprises said conformable layer having a surface substantially conforming to said housing surface.

37. The cooled electronic system according to claim 21, wherein either a thermoelectric cooler or a thermal insulator is disposed adjacent each surface of said electronic component so that no surface of said electronic component has neither an insulator nor a thermoelectric cooler disposed adjacent therewith.

38. The cooled electronic system according to claim 21, wherein said first electronic component comprises:
   a) a printed circuit board, said printed circuit board having upper and lower surfaces, and wherein said first-electronic component further comprises a thermally conductive material encapsulating at least said upper surface of said printed circuit board, said thermally conductive encapsulating material forming a second surface of said first electronic component; and
   b) a layer of thermally conductive material covering said lower surface of said printed circuit board.

39. The cooled electronic system according to claim 21, further comprising:
   a) a second thermoelectric cooler, second thermoelectric cooler comprising (i) a hot plate on one side thereof, (ii) a cold plate on another side thereof, and (iii) means for transferring heat from said cold plate to said hot plate;
   b) a second electronic component, said second electronic component having at least first and second surfaces, said first surface of said second electronic component being in heat flow communication with said cold plate of said second thermoelectric cooler, whereby said cold plate of said second thermoelectric cooler receives heat from said second electronic component and transfers said received heat to said hot plate of said second thermoelectric cooler;
   c) a layer of solid thermal insulation material covering said second surface of said second electronic component and disposed between said second surface of said second electronic component and said housing; and
   d) wherein said thermal conductor has a third surface, said third surface of said thermal conductor in contact with said hot plate of said second thermoelectric cooler.

40. The cooled electronic system according to claim 21, wherein said first electronic component comprises a printed circuit board.

41. The cooled electronic system according to claim 40, wherein said printed circuit board has upper and lower surfaces, and wherein said electronic component further comprises a thermally conductive material encapsulating at least said upper surface of said printed circuit board.

42. The cooled electronic system according to claim 41, wherein said cold plate of said first thermoelectric cooler is in conductive heat flow communication with said thermally conductive encapsulating material.

43. The cooled electronic system according to claim 41, wherein said first electronic component further comprises a layer of thermally conductive material covering said lower surface of said printed circuit board, said cold plate of said first thermoelectric cooler being in heat flow communication with said thermally conductive layer.

44. The cooled electronic system according to claim 21, wherein said first thermoelectric cooler comprises first and second dissimilar semiconductors.

45. The cooled electronic system according to claim 21, wherein said thermal conductor is integrally formed with said housing.

46. The cooled electronic system according to claim 21, wherein said thermal conductor is substantially formed from a material having a coefficient of thermal conductivity of at least about 1.0 BTU/hr-ft-° F.

47. The cooled electronic system according to claim 46, wherein said thermal conductor is substantially formed from a material having a coefficient of thermal conductivity of at least about 20 BTU/hr-ft-°F.

48. The cooled electronic system according to claim 21, further comprising a plurality of additional thermoelectric coolers having cold plates and hot plates, said plurality of thermoelectric coolers arranged in a planar array so that said cold plate of each or said thermoelectric coolers is in surface contact with said first electronic component.

49. A cooled electronic system for use in a well containing a fluid, said cooled electronic system comprising:
   a) a housing adapted to be disposed within said well, whereby said housing is exposed to said fluid and is in convective heat transfer therewith;
   b) a thermoelectric cooler, said thermoelectric cooler comprising (i) a hot plate on one side thereof, (ii) a cold plate on another side thereof, and (iii) means for transferring heat from said cold plate to said hot plate;
   c) an electronic component, said electronic component forming a first surface thereof, said first surface of said electronic component being in heat flow communication with said cold plate of said thermoelectric cooler, whereby said cold plate receives heat from said electronic component and transfers said received heat to said hot plate; and
   d) means for placing said hot plate of said thermoelectric cooler in conductive heat transfer communication with said housing, whereby heat from said hot plate is conducted to said housing and then transferred from said housing to said fluid by convective heat transfer, said conductive heat transfer means comprising a chassis on which said electronic component and said thermoelectric cooler are mounted.

50. The cooled electronic system according to claim 49, wherein said chassis has first and second heat transfer surfaces, said chassis first heat transfer surface being in direct conductive heat flow communication with said hot plate, said chassis second heat transfer surface being in direct conductive heat flow communication with said housing, whereby heat flows from said electronic component to said thermoelectric cooler and then to said chassis and then to said housing.

51. The cooled electronic system according to claim 50, further comprising means for urging said chassis second heat transfer surface into surface contact with said housing.

52. The cooled electronic system according to claim 49, wherein said chassis has first and second heat transfer surfaces, said chassis first heat transfer surface being in direct conductive heat flow communication with said electronic component first surface, said chassis second heat transfer surface being in direct conductive heat flow communication with said thermoelectric cooler, whereby heat flows from said electronic component to said chassis and then to said thermoelectric cooler and then to said housing.

53. The cooled electronic system according to claim 49, wherein said chassis is a thermal conductor.

54. The cooled electronic system according to claim 49, wherein said electronic component forms a second surface, an insulator covering at least a portion of said second surface, the thermal conductivity of said chassis being at least twenty times greater than the thermal conductivity of said insulator.

55. A cooled electronic system for use in a well containing a fluid, said cooled electronic system comprising:
  a) a housing adapted to be disposed within said well, whereby said housing is exposed to said fluid and is in convective heat transfer therewith;
  b) a thermoelectric cooler, said thermoelectric cooler comprising (i) a hot plate on one side thereof, (ii) a cold plate on another side thereof, and (iii) means for transferring heat from said cold plate to said hot plate;
  c) an electronic component, said electronic component forming a first surface thereof, said first surface of said electronic component being in heat flow communication with said cold plate of said thermoelectric cooler, whereby said cold plate receives heat from said electronic component and transfers said received heat to said hot plate, either a thermoelectric cooler or a thermal insulator being disposed adjacent each surface of said electronic component so that none of the surfaces of said electronic component have neither an insulator or a thermoelectric cooler disposed adjacent therewith; and
  d) means for placing said hot plate of said thermoelectric cooler in conductive heat transfer communication with said housing, whereby heat from said hot plate is conducted to said housing and then transferred from said housing to said fluid by convective heat transfer.

56. A cooled electronic system for use in a well containing a fluid, said cooled electronic system comprising:
  a) a housing adapted to be disposed within said well, whereby said housing is exposed to said fluid and is in convective heat transfer therewith;
  b) a thermoelectric cooler, said thermoelectric cooler comprising (i) a hot plate on one side thereof, (ii) a cold plate on another side thereof, and (iii) means for transferring heat from said cold plate to said hot plate;
  c) an electronic component, said electronic component forming a first surface thereof, said first surface of said electronic component being in heat flow communication with said cold plate of said thermoelectric cooler, whereby said cold plate receives heat from said electronic component and transfers said received heat to said hot plate; and
  d) means for placing said hot plate of said thermoelectric cooler in conductive heat transfer communication with said housing, whereby heat from said hot plate is conducted to said housing and then transferred from said housing to said fluid by convective heat transfer, said conductive heat transfer means comprising said thermoelectric cooler being disposed between said electronic component and said housing so as to place said thermoelectric cooler in direct conductive heat flow communication with said housing, whereby heat flows from said electronic component to said thermoelectric cooler and then to said housing.

57. A cooled electronic system for use in a well containing a fluid, said cooled electronic system comprising:
  a) a housing adapted to be disposed within said well, whereby said housing is exposed to said fluid and is in convective heat transfer therewith, said housing having a surface, a layer of conformable material in contact with said housing surface and substantially conforming therewith;
  b) a thermoelectric cooler, said thermoelectric cooler comprising (i) a hot plate on one side thereof, (ii) a cold plate on another side thereof, and (iii) means for transferring heat from said cold plate to said hot plate;
  c) an electronic component, said electronic component forming a first surface thereof, said first surface of said electronic component being in heat flow communication with said cold plate of said thermoelectric cooler, whereby said cold plate receives heat from said electronic component and transfers said received heat to said hot plate; and
  d) means for placing said hot plate of said thermoelectric cooler in conductive heat transfer communication with said housing, whereby heat from said hot plate is conducted to said housing and then transferred from said housing to said fluid by convective heat transfer.

\* \* \* \* \*

UNITED STATES PATENT AND TRADEMARK OFFICE
CERTIFICATE OF CORRECTION

PATENT NO. : 5,931,000
DATED : August 3, 1999
INVENTOR(S) : Turner et al.

Page 1 of 2

It is certified that error appears in the above-identified patent and that said Letters Patent is hereby corrected as shown below:

Cover Page, Line 14 of "Abstract" delete "may also includes a" and insert --may also include a-- therefor.
Cover Page, Line 16 of "Abstract" delete "transfer heat from the an electronic" and insert --transfers heat from an electronic-- therefor.
Column 4, Line 49, delete "take" and insert --taken-- therefor.
Column 11, Line 32, delete "housing 32, the hot" and insert --housing 52, the heat-- therefor.
Column 11, Line 37, delete "S4 and the house 52" and insert --54 and the housing 52-- therefor.
Column 11, Line 48, delete "0.08-BTU/hr-ft-°F." and insert --0.08 BTU/hr-ft-°F.-- therefor.
Column 11, Line 51, delete "wit one" and insert --with one-- therefor.
Column 11, Line 62, delete "employed Instead" and insert --employed instead-- therefor.
Column 12, Line 62, delete "relied up" and insert --relied upon-- therefor.
Column 13, Line 40, delete "hereby" and insert --thereby-- therefor.
Column 13, Line 49, after "function." insert --Alternatively, the gaps 61 may be evacuated to reduce heat transfer.-- therefor
Column 13, Lines 50 and 51, delete "Alternatively, the gaps 61 may be evacuated to reduce heat transfer."
Column 14, Line 12, delete "undergoing" and insert --undergo--therefor.
Column 14, Line 27, delete "surfaces" and insert --surface-- therefor.
Column 15, Line 29, delete "62'" and insert --62"-- therefor.

UNITED STATES PATENT AND TRADEMARK OFFICE
CERTIFICATE OF CORRECTION

PATENT NO. : 5,931,000
DATED : August 3, 1999
INVENTOR(S) : Turner et al.

It is certified that error appears in the above-identified patent and that said Letters Patent is hereby corrected as shown below:

Column 16, Line 38, delete "embodiment" and insert --embodiments-- therefor.
Column 17, Line 16, delete "206°C.," and insert --200°C.,-- therefor.
Column 18, Line 6 of Claim 13, delete "communication said" and insert --communication with said-- therefor.
Column 19, Line 7 of Claim 21, delete "fast" and insert --first-- therefor.
Column 21, Line 4 of Claim 38, delete "first-" and insert insert --first-- therefor.
Column 22, Line 5 of Claim 48, delete "each or said" and insert -- each of said-- therefor.

Signed and Sealed this

Eighth Day of May, 2001

Attest:

NICHOLAS P. GODICI

Attesting Officer

Acting Director of the United States Patent and Trademark Office